United States Patent
Eya

(10) Patent No.: US 7,467,360 B2
(45) Date of Patent: Dec. 16, 2008

(54) LSI DESIGN SUPPORT APPARATUS AND LSI DESIGN SUPPORT METHOD

(75) Inventor: Minori Eya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 276 days.

(21) Appl. No.: 11/526,742

(22) Filed: Sep. 26, 2006

(65) Prior Publication Data

US 2007/0069208 A1    Mar. 29, 2007

(30) Foreign Application Priority Data

Sep. 27, 2005  (JP)  ............................. 2005-279869

(51) Int. Cl.
  *G06F 17/50* (2006.01)
  *H03K 17/693* (2006.01)
  *H01L 23/58* (2006.01)
(52) U.S. Cl. ................................ 716/1; 716/15; 257/48
(58) Field of Classification Search .................... 716/1, 716/15; 257/48
  See application file for complete search history.

(56) References Cited

U.S. PATENT DOCUMENTS 6,423,578 B2 * 7/2002 Maeda ....................... 438/118
6,893,941 B2 * 5/2005 Suda ........................... 438/455
2005/0275113 A1 * 12/2005 Park et al. .................... 257/778
2007/0240092 A1 * 10/2007 Lee et al. ....................... 716/17
2008/0163139 A1 * 7/2008 Scheffer et al. ................. 716/4

FOREIGN PATENT DOCUMENTS

JP    7-152811    6/1995

* cited by examiner

*Primary Examiner*—Vuthe Siek
*Assistant Examiner*—Magid Y Dimyan
(74) *Attorney, Agent, or Firm*—Young & Thompson

(57) ABSTRACT

An LSI design support apparatus includes a data acquisition section and an equal processing section. The data acquisition section acquires first position data concerning positions of a plurality of first electrodes provided along a side of a first substrate, and second position data concerning positions of a plurality of second electrodes provided along a side of a second substrate. The equal processing section sets connection relations between the plurality of the first electrodes and the plurality of the second electrodes such that each of the plurality of the first electrodes is connected to one of the plurality of the second electrodes which has a second relative position nearest to a first relative position of the each of the plurality of the first electrodes.

20 Claims, 20 Drawing Sheets

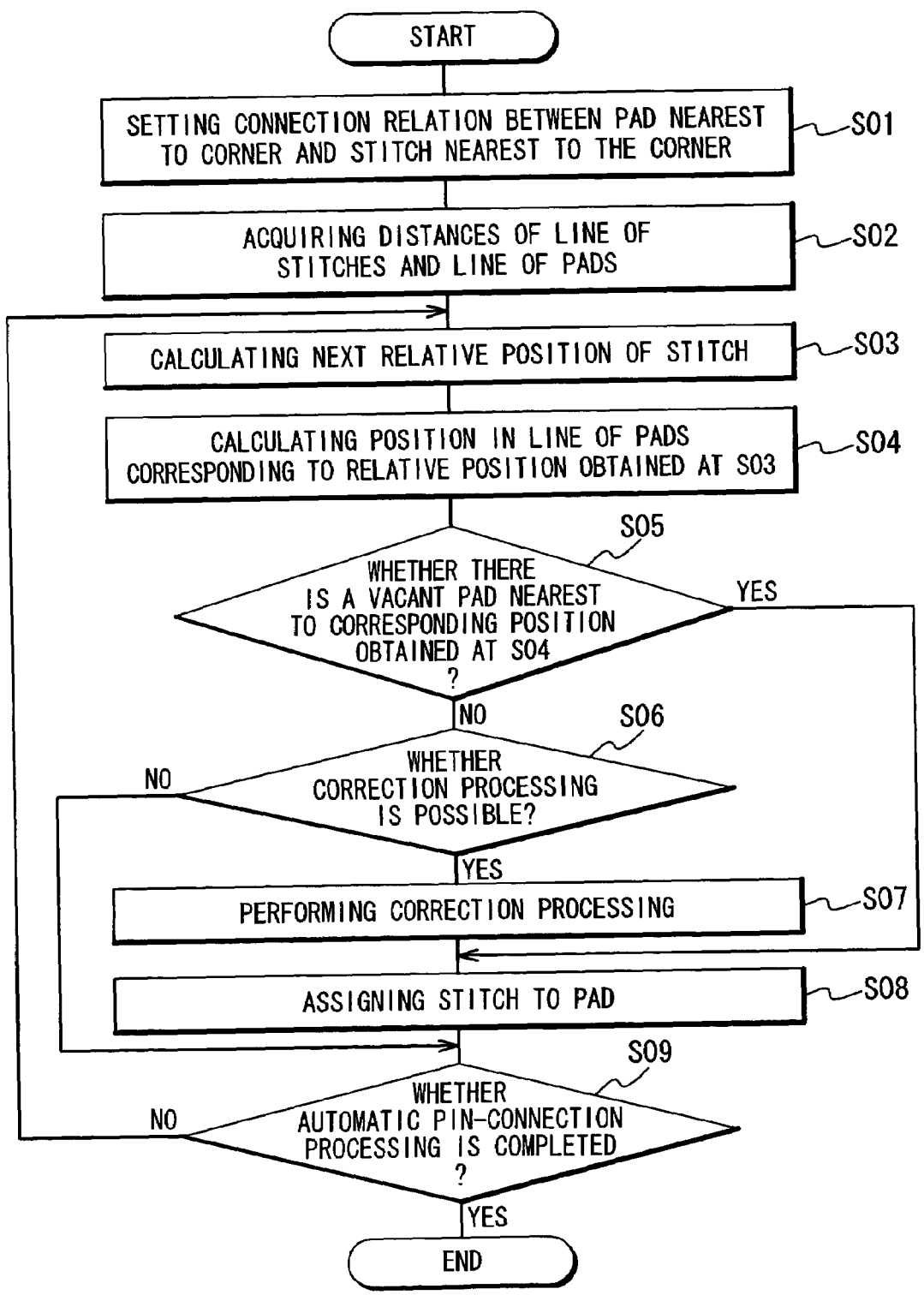

LSI DESIGN SUPPORT APPARATUS AND LSI DESIGN SUPPORT METHOD

BACKGROUND OF THE INVENTION

1. Field of the Invention

The present invention relates to an LSI design support apparatus and an LSI design support method. More particularly, the present invention relates to an LSI design support apparatus and an LSI design support method used for setting connection relations between substrates.

2. Description of the Related Art

In LSI design, a process of a study of assembly is known in which selection of a package substrate of an LSI, and electrical connection between the package substrate and a chip substrate of the LSI are studied. In the process of the study of assembly, a package substrate of an LSI that suits a chip substrate of the LSI is firstly selected. After that, connection relations, which pad in the chip substrate should be connected to a stitch (or lead) of the package substrate with a bonding wire, are studied. In the description below, the connection relation between the stitch of the package substrate and the pad of the chip substrate is also referred to as "pin-connection", and processing to set the pin-connection is also referred to as "pin-connection processing". The pin-connection processing in the study of assembly has been manually conducted so far by designers while looking at CAD (Computer aided design) drawings.

As a technique relevant to the process of the study of assembly, for example, an LSI assembly design support system is disclosed in Japanese Laid Open Patent Application JP-A-Heisei 7-152811. FIG. 1 is a block diagram showing a configuration of the LSI assembly design support system. The LSI assembly design support system determines electrical connection between pads and an LSI package, and determines each pad to be electrically connected to an external pin of the LSI package for each LSI package into which a chip is installed. The LSI assembly design support system includes: (A) a chip-data input means 102; (B) an LSI-package-data input means 103; (C) an external-pin electrical-properties specifying means 104; (D) a pin-connection means 105; (E) an assembly check means 106; (F) an electrical-properties check means 107; an interface section 101; and a memory section 108. The chip-data input means 102 supplies data of an external form of an LSI chip, pad coordinates, and conditions of electrical properties which the pad can have. The LSI-package-data input means 103 supplies data with respect to an LSI package into which the chip supplied by the chip-data input means 102 is to be installed. The external-pin electrical-properties specifying means 104 specifies electrical properties of the external pins of the LSI package supplied by the LSI-package-data input means 103. The pin-connection means 105 specifies electrical connections between the pads of the chip supplied by the chip-data input unit 102 and the LSI-package-data input means 103, and the external pins of the LSI package. The assembly check means 106 checks whether the electrical connections specified at the pin-connection means 105 satisfy assembly conditions in actual assembly processing of the chip and the LSI package. The electrical-properties check means 107 checks whether electrical properties of the pads of the chip can be the same as those of the external pins of the LSI package connected through the electrical connections specified by the pin-connection means 105.

In the case of the LSI assembly design support system of the above related art, a worker performs assembly design for an LSI package on a dialogue basis while specifying connection between each external pin of the LSI package and each pad of a chip, at the pin-connection means 105. Such design requires that setting of a connection relation between the external pin of the LSI package and the pad of the chip through a wiring all be conducted by manual work. Therefore, the heavy burden is imposed on the worker, requiring a great number of man-hours. As a result, long working time is necessary. In particular, the number of pads and the number of pins of a package are increased with the miniaturization of pad pitches. Therefore, the worker needs to conduct an enormous amount of pin-connection processing manually, causing the heavier burden on the worker. A technique is desired which is capable of reducing the work burden on the worker, working man-hours, working time, and manufacturing time.

SUMMARY OF THE INVENTION

In order to achieve an aspect of the present invention, the present invention provides an LSI design support apparatus including: a data acquisition section configured to acquire first position data concerning positions of a plurality of first electrodes provided along a side of a first substrate, and second position data concerning positions of a plurality of second electrodes provided along a side of a second substrate; and an equal processing section configured to set connection relations between the plurality of the first electrodes and the plurality of the second electrodes such that each of the plurality of the first electrodes is connected to one of the plurality of the second electrodes which has a second relative position nearest to a first relative position of the each of the plurality of the first electrodes, wherein the first relative position is a relative position of each of the plurality of the first electrodes in a line of the plurality of the first electrodes defined based on the first position data, and wherein the second relative position is a relative position of each of the plurality of the second electrodes in a line of the plurality of the second electrodes defined based on the second position data.

In the automatic design according to the present invention, connection relations can be set between the plurality of the first electrodes and the plurality of second electrodes such that the first electrode is connected to the second electrode which has the relative position close to that of the first electrode. This leads to obtain a reasonable connection relations in which wiring intervals are approximately equal to each other, and almost same as the connection relations obtained by a manual work.

The present invention makes it possible to alleviate the work burden on workers, and reduce working man-hours, working time, and manufacturing time. It is also possible to improve an yield with reduction in the manufacturing time.

BRIEF DESCRIPTION OF THE DRAWINGS

The above and other objects, advantages and features of the present invention will be more apparent from the following description taken in conjunction with the accompanying drawings, in which:

FIG. 9 is a flowchart showing operations of the automatic pin-connection section in the LSI design support method of FIG. 8;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of an LSI design support apparatus and an LSI design support method according to the present invention will be described below with reference to the attached drawings.

First Embodiment

Figure 1:
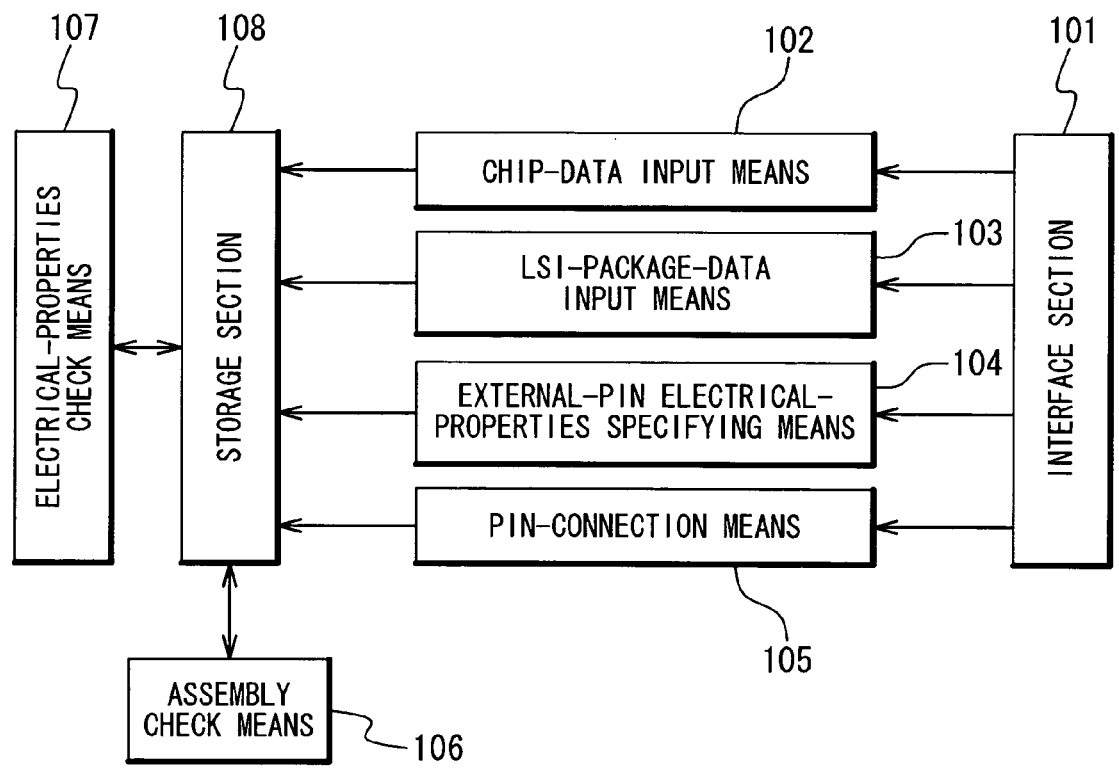
FIG. 1 is a block diagram showing a configuration of a conventional LSI assembly design support system.
Figure 2:
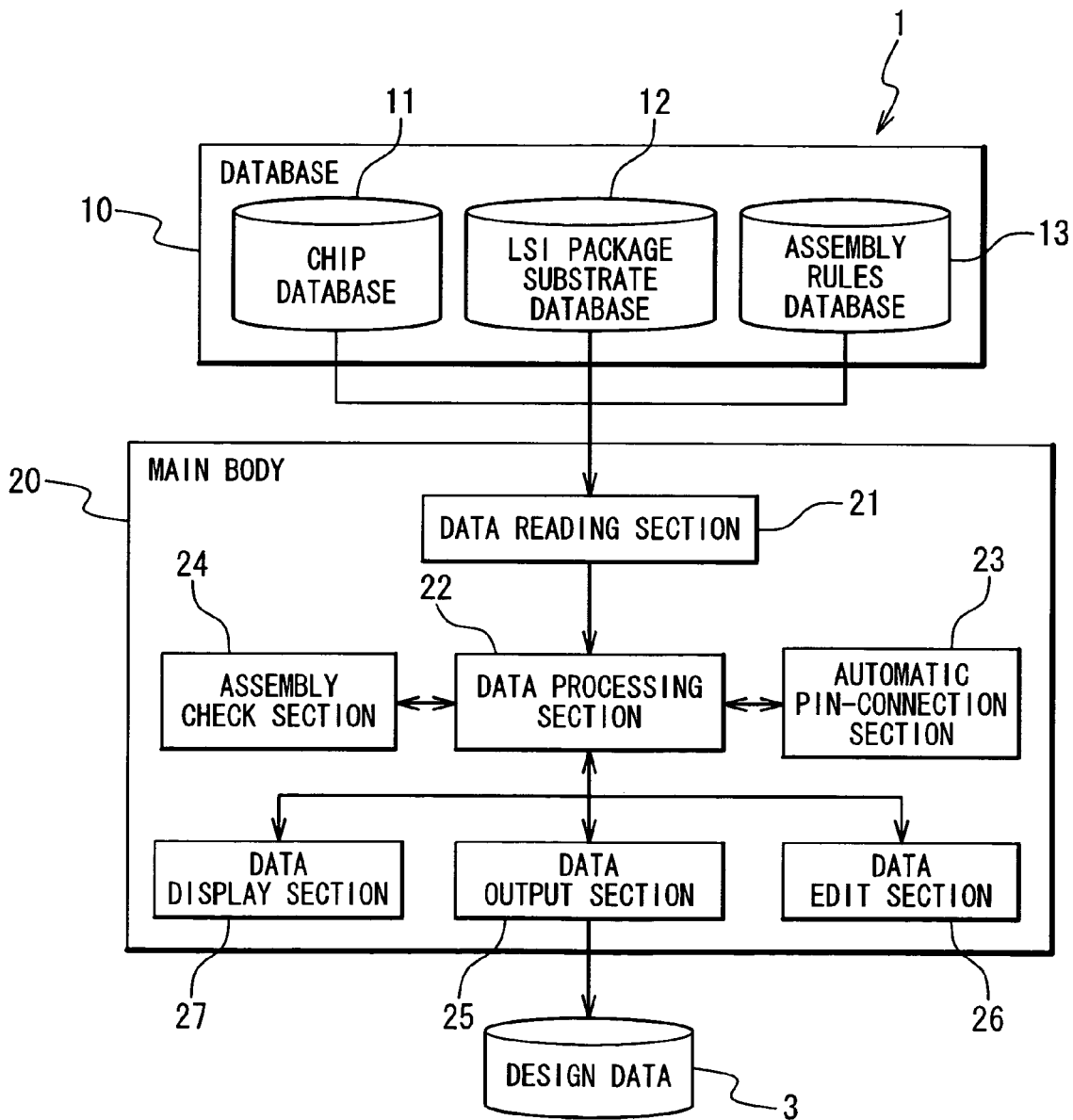
FIG. 2 is a block diagram showing a configuration of an LSI design support apparatus in the first embodiment of the present invention.

First, a configuration of an LSI design support apparatus in the first embodiment of the present invention will be described. FIG. 2 is a view showing a block diagram of the configuration of the LSI design support apparatus in the first embodiment of the present invention. The LSI design support apparatus 1 includes a database 10 and a main body 20 of the LSI design support apparatus.

The database 10 is a memory unit exemplified by hard disk drives (HD), storing data with respect to LSI design. The database 10 includes a chip database 11, an LSI package substrate database 12, and an assembly rules database 13 as data and programs.

The chip database 11 stores chip data as data with respect to LSI chip substrates. The chip data includes coordinates data of a plurality of pads provided to a chip in correspondence to the kinds and sizes of chips. The LSI package substrate database 12 stores package data as data with respect to LSI package substrates. The package data includes coordinates data of a plurality of stitches provided to a package substrate in correspondence to the kinds and sizes of package substrates. The assembly rules database 13 stores an assembly rules file as a file where assembly rules are described. The assembly rules file includes assembly rules on wiring such as wire lengths, wire angles, and intersection rules of wires which connect the pads and the stitches.

The main body 20 is an information processing device exemplified by a personal computer and a workstation. A display unit (not shown), an input unit (not shown), and an output unit (not shown) are connected thereto, as peripherals. Based on the data and file of the database 10, the main body 20 sets connection relations between pads of a chip substrate of an LSI and stitches of a package substrate of the LSI (performs pin-connection processing), and outputs the connection relations as a design data 3. The main body 20 includes a data reading section 21, a data processing section 22, an automatic pin-connection section 23, an assembly check section 24, a data output section 25, a data edit section 26, and a data display section 27 as programs.

The data reading section 21 reads each of the files (the chip data, package data, and assembly rules file) of the database 10. The data processing section 22 combines the read chip data and package data, and outputs the resultant data to the automatic pin-connection section 23. The data processing section 22 also controls data transfer among the sections. The automatic pin-connection section 23 performs pin-connection processing with respect to pads of a chip substrate and stitches of a package substrate by referring to the assembly rules file, based on a combination of a chip and an LSI package. The assembly check section 24 checks whether the pin-connection of generated design data meets the assembly rules by referring to the assembly rules file. The data output section 25 outputs the design data 3 to the output unit (not shown). The data edit section 26 performs editing of design data such as making of new connection, deleting of the connection and changing of the connection between the pad of the chip substrate and the stitch of the package substrate in the design data, based on worker's input through the input unit (not shown). The data display section 27 displays data defined as graphics, of the chip, package, and wire in the design data, on the display unit (not shown).

The data reading section 21, the data processing section 22, the automatic pin-connection section 23, the assembly check section 24, the data output section 25, the data edit section 26, and the data display section 27 are stored in a memory unit (not shown) in the main body 20. These sections are loaded on a memory (not shown) at the time of operation, and operated by a CPU (not shown). All of or part of the sections may be provided by the combination of software and hardware and only by hardware. Additionally, the main body 20 may include the database 10.

Figure 3:
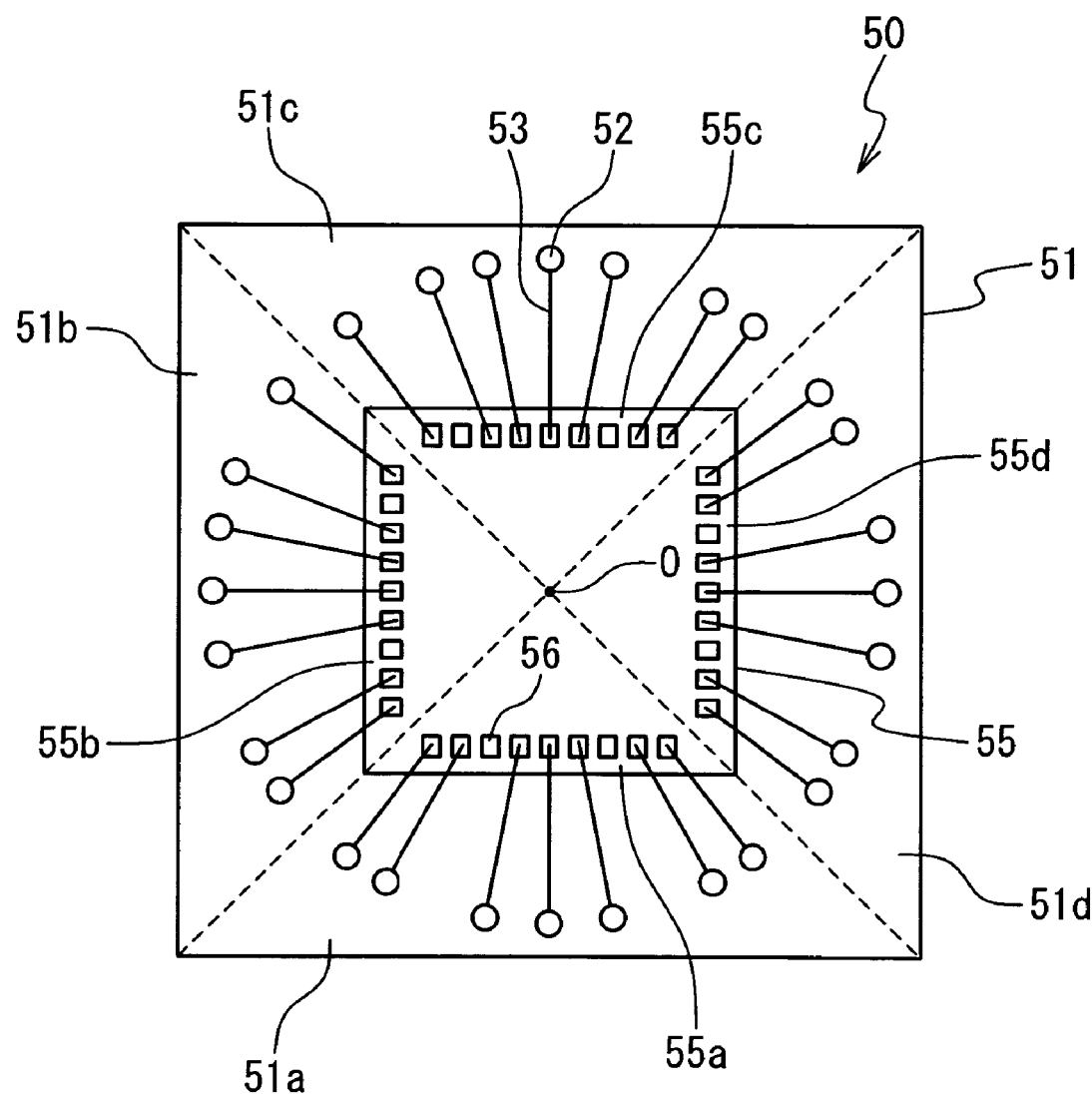
FIG. 3 is a schematic view showing an ASIC chip designed by the LSI design support apparatus of the present invention.

FIG. 3 is a schematic view showing an ASIC chip (LSI) designed by the LSI design support apparatus of the present invention. The ASIC chip 50 includes a package substrate 51 of an LSI package and a chip substrate 55 of a chip. The package substrate 51 and the chip substrate 55 are divided into four regions by imaginary diagonal lines. The four regions are: a package substrate region 51a and a chip substrate region 55a; a package substrate region 51b and a chip substrate region 55b; a package substrate region 51c and a chip substrate region 55c; and a package substrate region 51d and a chip substrate region 55d. Each of the four regions has the same structure, arranged in different directions. For this reason, the package substrate region 51a and the chip substrate region 55a are explained below as examples of the package substrate 51 and the chip substrate 55, respectively.

The package substrate 51 includes a plurality of stitches 52 along one side of the package substrate 51. The chip substrate 55 includes a plurality of pads 56 along one side of the chip substrate 55. In the ASIC chip 50, the coordinates of the plurality of the pads 56 and the plurality of the stitches 52 are determined beforehand, prior to the pin-connection processing. The number of the pads 56 is usually greater than the number of the stitches 52 (which correspond to external pins). Each of the plurality of the stitches 52 is connected to one of the plurality of the pads 56 with a wire 53. The LSI design support apparatus of the present invention creates the design data 3 of the ASIC chip 50 explained above.

Figure 4:
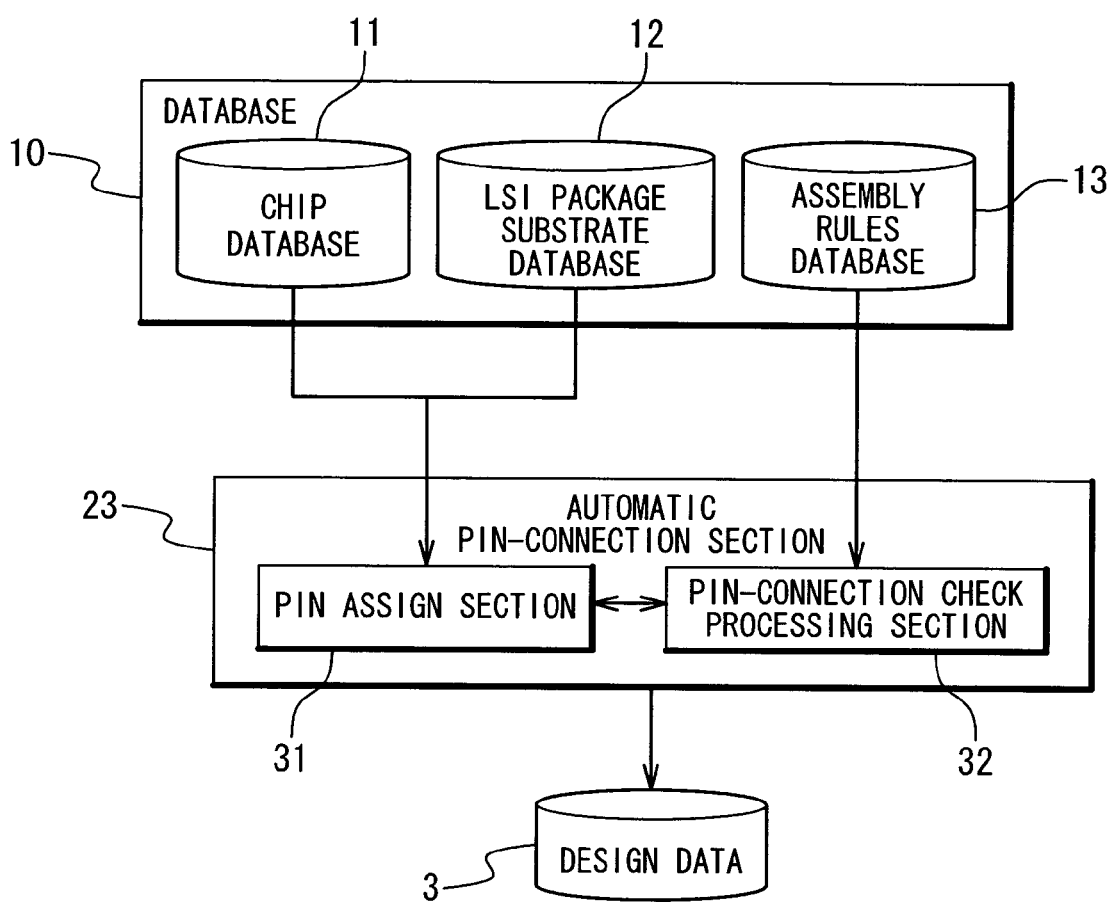
FIG. 4 is a block diagram showing a configuration of an automatic pin-connection section of FIG. 2 in the first embodiment.

FIG. 4 is a block diagram showing a configuration of the automatic pin-connection section in FIG. 2 in the first embodiment. The automatic pin-connection section 23 includes a pin assign section 31 and a pin-connection check processing section 32. The pin assign section 31 performs pin-connection processing with respect to the pads of the chip substrate and the stitches of the package substrate, based on the combination of the chip and the LSI package. The pin-connection check processing section 32 checks whether generated pin-connection meets the assembly rules, by referring to the assembly rules file. When the pin-connection does not meet the assembly rules, the pin assign section 31 performs correction of the pin-connection.

Figure 5:
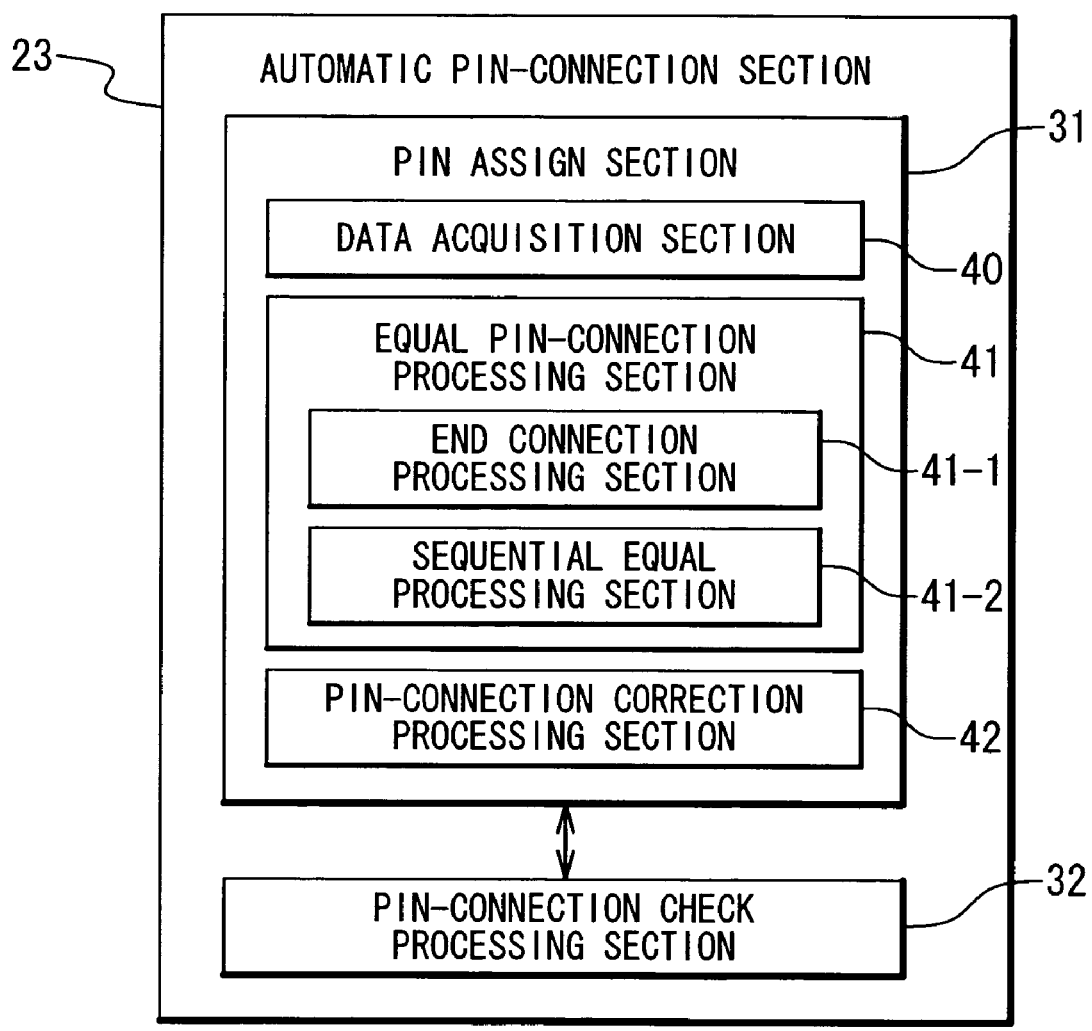
FIG. 5 is a block diagram showing a configuration of the automatic pin-connection section of FIG. 4 in the first embodiment.

FIG. 5 is a block diagram showing the configuration of the automatic pin-connection section in FIG. 4 in the first embodiment. The pin assign section 31 of the automatic pin-connection section 23 includes a data acquisition section 40, an equal pin-connection processing section 41, and a pin-connection correction processing section 42.

The data acquisition section 40 acquires respective coordinates (X, Y) of the plurality of the stitches 52 provided along the side of the package substrate 51, from read data. The data acquisition section 40 also acquires respective coordinates (x, y) of the plurality of the pads 56 provided along the side of the chip substrate 55. Here, the origin of the XY coordinates (stitch coordinates) with respect to the package substrate 51 and the origin of the xy coordinates (pad coordinates) with respect to the pad substrate 55 are each defined. A relative positional relation therebetween is also defined.

When the read data includes relative positions, the data acquisition section 40 acquires a relative position of each of the plurality of the stitches 52 provided along the side of the package substrate 51. In addition, the data acquisition section 40 acquires a relative position of each of the plurality of the pads 56 provided along the side of the chip substrate 55. Here, the relative positions show relative positional relations of a plurality of electrodes (the stitches 52 and the pads 56) between each other.

The equal pin-connection processing section 41 calculates the relative position of each of the plurality of the stitches 52 based on the coordinates of the plurality of the stitches 52. Similarly, the equal pin-connection processing section 41 calculates the relative position of each of the plurality of the pads 56 based on the coordinates of the plurality of the pads 56. Then the equal pin-connection processing section 41 sets connection relations between the plurality of the stitches 52 and the plurality of the pads 56 such that each of the plurality of the stitches 52 is connected to one of the plurality of the pads 56 that has the relative position nearest to the relative position of the each of the plurality of the stitches 52. The equal pin-connection processing section 41 includes an end connection processing section 41-1 and a sequential equal processing section 41-2.

The end connection processing section 41-1 sets a connection relation between a stitch 52 at an end among the plurality of the stitches 52 and a pad 56 at an end among the plurality of the pads 56, such that the stitch 52 at the end is connected to the pad 56 at the end.

The sequential equal processing section 41-2 sets a connection relation between one of the plurality of the stitches 52, which is not the stitch 52 at the end and which is the nearest to one with a connection relation already set among the stitches 52, and a pad 56 having the relative position nearest to the relative position of that stitch 52, such that this stitch 52 is connected to this pad 56. The sequential equal processing section 41-2 performs setting of such connection relations in order starting from the one next to the stitch 52 at the end among the plurality of the stitches 52.

When the connection relation set by the equal pin-connection processing section 41 is not appropriate, the pin-connection correction processing section 42 performs correction processing to make the connection relation have an appropriate state (which meets the assembly rules concerning wiring such as double connection, wire lengths, wire angles, and intersection rules). For example, when a connection relation is already set to the pad 56 that is suited to a certain stitch 52, all of or part of the adjacent connection relations are shifted toward the pad 56 at the end, to vacate the connection relation of the pad 56 that is suited to the stitch 52.

Figure 6:
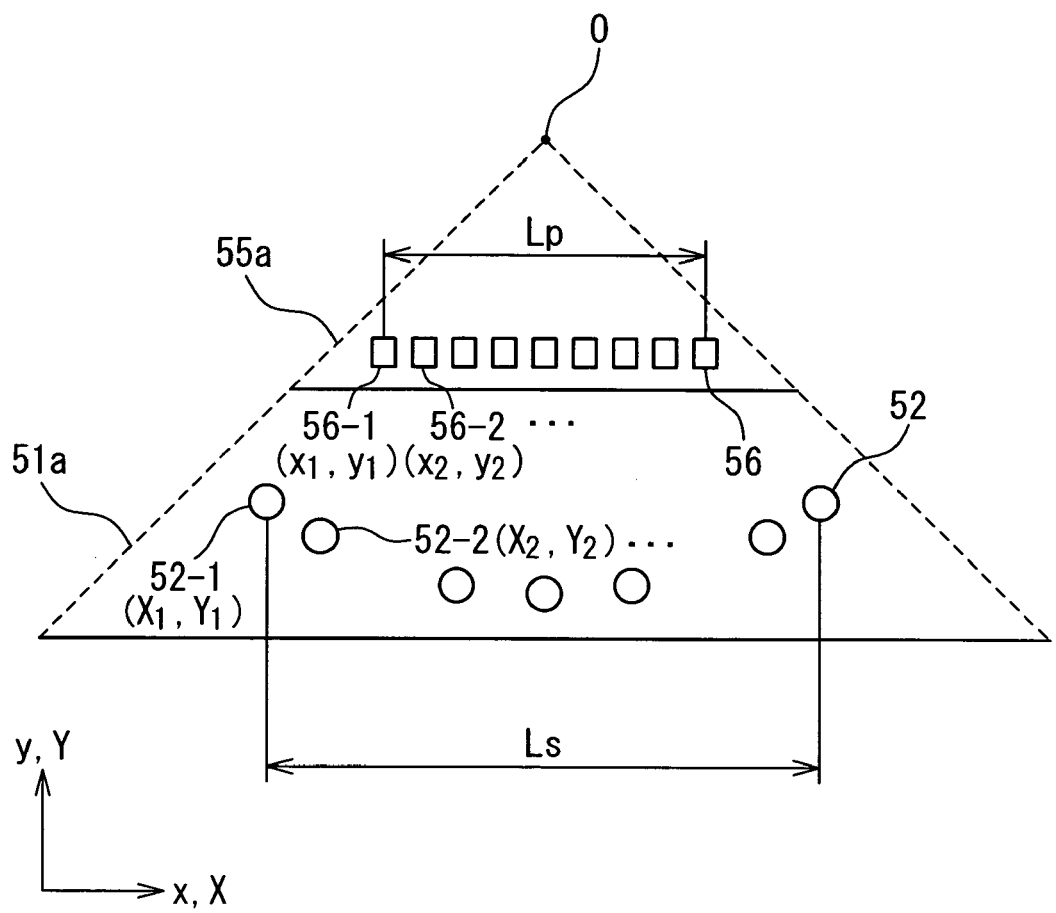
FIG. 6 is a schematic view showing an example of coordinates of each electrode.

FIG. 6 is a schematic view showing an example of coordinates of each electrode. The direction parallel to the sides of the package substrate 51 and the pad substrate 55 are the X-axis and the x-axis, while the direction vertical to the sides of the packages substrate 51 and the pad substrate 55 are the Y-axis and the y-axis. Here, an intersection point O of the diagonal lines in FIG. 3 is defined as the common origin of the stitch coordinates and the pad coordinates. In FIG. 6, the seven stitches 52 are provided to one side of the package substrate 51 in approximately an arc form, and the nine pads 56 are provided to the one side of the pad substrate 55 in approximately a straight line. For example, in the line of the stitches 52, the coordinates of the leftmost stitch 52-1 are $(X_1, Y_1)$, the coordinates of the next stitch 52-2 are $(X_2, Y_2)$, and so forth. In the line of the pads 56, the coordinates of the leftmost pad 56-1 are $(x_1, y_1)$, the coordinates of the next pad 56-2 are $(x_2, y_2)$, and so forth.

The pin-connection processing deals with only the X-coordinate and the x-coordinate of each electrode for each line of the electrodes. Consequently, no problems occur in dealing with the line of the pads 56 provided in approximately the straight line, even when the line of the stitches 52 is provided in approximately the arc form. In other words, no problems occur even when the line of the stitches and the line of the pads are not parallel to each other. However, the X-coordinate and the Y-coordinate, and the x-coordinate and the y-coordinate is used for the verification of the connections based on the assembly rules and so on.

Figure 7:
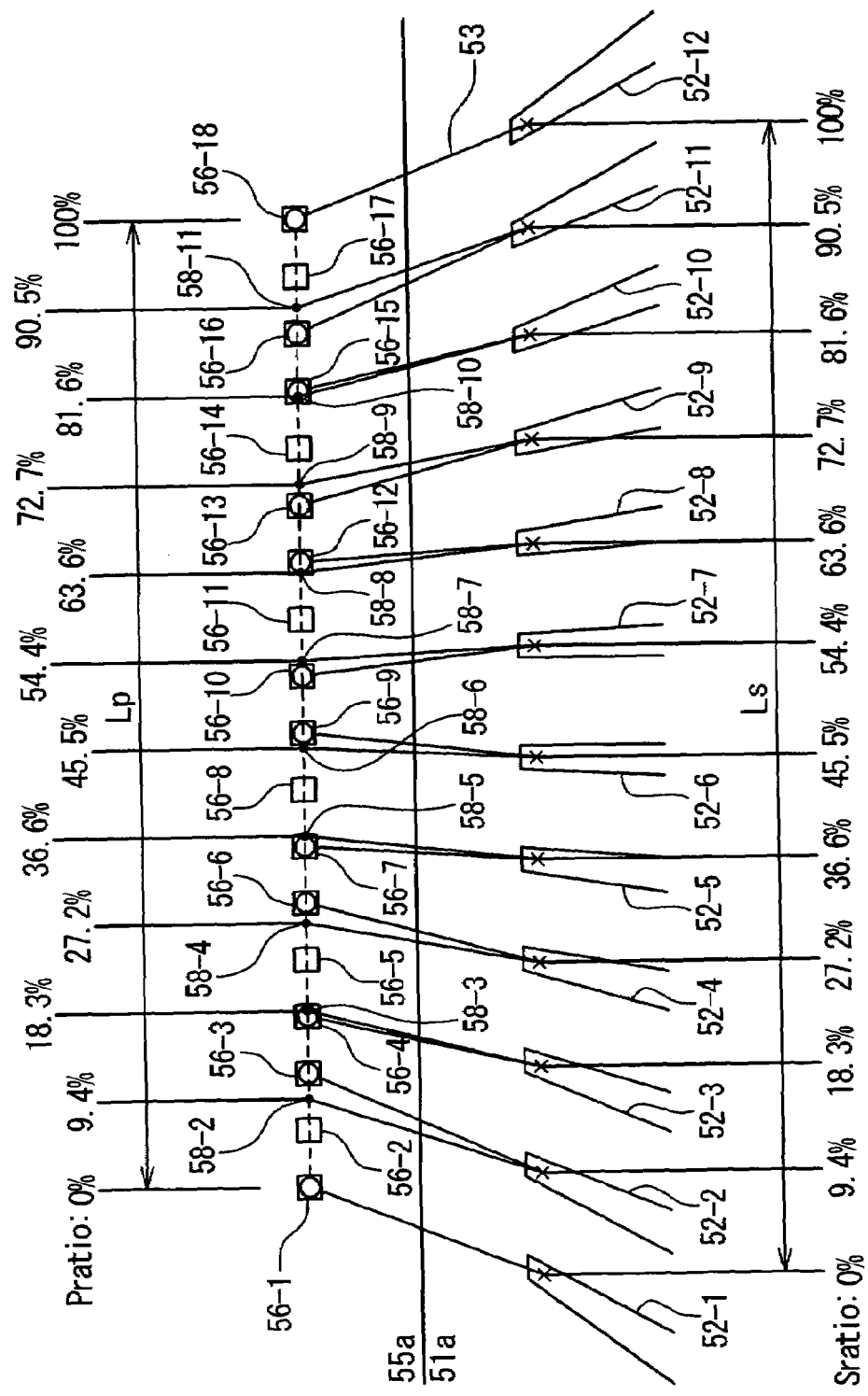
FIG. 7 is a schematic view showing an example of relative positions of each electrode.

FIG. 7 is a schematic view showing an example of relative positions of each electrode. In FIG. 7, the twelve stitches 52 are provided to the one side of the package substrate 51 and the eighteen pads 56 are provided to the one side of the pad substrate 55. Here, as mentioned above, the Y-coordinate and the y-coordinate are not taken into consideration. For this reason, FIG. 7 shows the stitches 52 and the pads 56 both arranged in approximately a straight line.

The relative position is an index indicating relative relations of positions of all the electrodes, where the position of the stitch 52-1 at one end of the line among the stitches 52 in the line is 0% and the position of the stitch 52-12 at the other end of the line is 100% for instance. At this time, a relative position $S_{ratio}(p)$ of a stitch 52-p at No. p (p: an integer satisfying 1<p<12) is calculated by the following equation:

$S_{ratio}(p)$=(distance between the first stitch and the $p$-th stitch)/(distance $Ls$ between the first stitch and the twelfth stitch)×100(%)     (1)

Each distance is calculated from the coordinate (X-coordinate) of each of the stitches 52. For instance, the relative position $S_{ratio}(2)$ of the second stitch 52 is 9.4%.

Similarly, the relative position is an index indicating relative relations of positions of all the electrodes, where the position of the pad 56-1 at one end of the line among the line of the pads 56 is 0% and the position of the pad 56-18 at the other end of the line is 100%. At this time, a relative position $P_{ratio}(q)$ of a pad 56-q at No. q (q: an integer satisfying 1<q<18) is calculated by the following equation:

$P_{ratio}(q)$=(distance between the first pad and the $q$-th pad)/(distance $Lp$ between the first pad and the eighteenth pad)×100(%)     (2)

Each distance is calculated from the coordinate (x-coordinate) of each of the pads 56.

However, FIG. 7 shows not the $P_{ratio}$ but a relative position $P_{ratio}$ in the line of the pads 56 equivalent to the relative position $S_{ratio}$ of the stitch 52-p, and a corresponding position 58-p. For example, FIG. 7 shows the relative position $P_{ratio}$ in the line of the pads 56 equivalent to the relative position $S_{ratio}(2)$ of the stitch 52-2, which is 9.4%, and a corresponding position 58-2.

Figure 8:
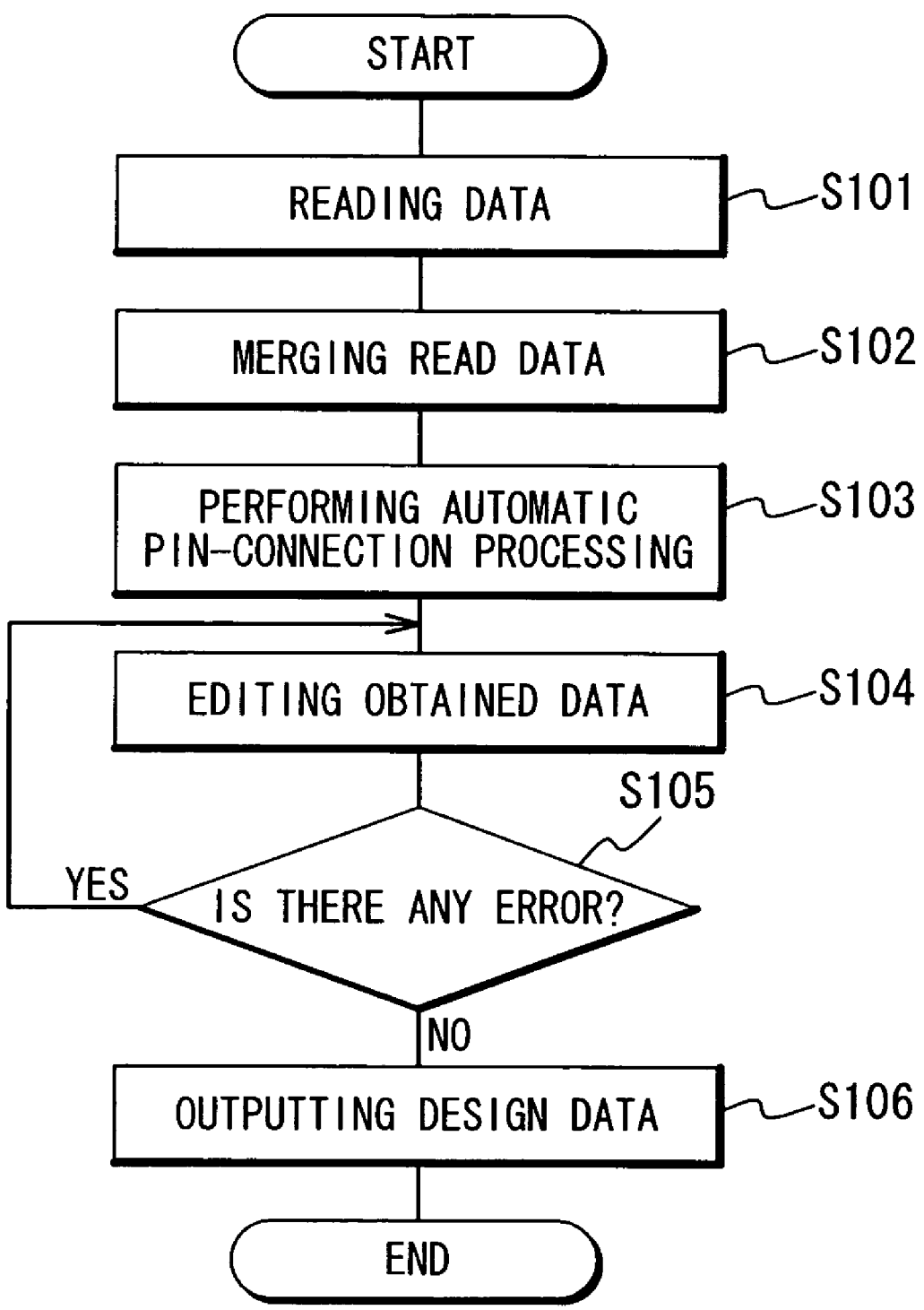
FIG. 8 is a flowchart showing operations of an LSI design support method in the first embodiment of the present invention.

Next, operations of the LSI design support method in the first embodiment of the present invention will be described. FIG. 8 is a flowchart showing the operations of the LSI design support method in the first embodiment of the present invention. The automatic pin-connection processing by the automatic pin-connection section 23 is performed separately for the package substrate region 51a and the chip substrate region 55a, the package substrate region 51b and the chip substrate region 55b, the package substrate region 51c and the chip substrate region 55c, and the package substrate region 51d and the chip substrate region 55d shown in FIG. 3. Description given below is on the automatic pin-connection processing for the package substrate region 51a and the chip substrate region 55a, as an example. Here, description is given on a case where the pad 56 and the stitch 52 are connected collectively.

First, a designer specifies the chip size of an LSI, the kind of a package substrate, and the number of pins, from the input unit (not shown) of the LSI design support apparatus. Based on the designer's input, the data reading section 21 reads chip data and package data from the chip database 11 and the LSI package substrate database 12, respectively. The data reading section 21 also reads an appropriate rules file from the assembly rules database 13, based on the combination of the specified chip size and package substrate (S101). The rules file describes rule values of wire lengths, wire angles, and wire intersection.

The data processing section 22 merges the read chip data and package data to create a single data (S102). At this time, the chip data includes the coordinates of the plurality of the stitches 52 of the package substrate 51. The origin of the coordinates is the intersection point O of the diagonal lines shown in FIG. 6. Similarly, the package data includes the coordinates of the plurality of the pads 56 of the chip substrate 55. The origin of the coordinates is also the intersection point O of the diagonal lines shown in FIG. 6. The data processing section 22 places the package substrate 51 and the chip substrate 55 such that the origins of the both coordinates overlap each other. The data display section 27 displays the resultant data on the display unit (not shown). The automatic pin-connection section 23 performs automatic pin-connection processing, based on the read chip data, package data, and rules file (S103). The data display section 27 displays the result of the automatic pin-connection processing (diagram in which the pads and the stitches are connected with the wires) on the display unit.

The data edit section 26 edits a pin-connection, based on designer's input referring to the display on the display unit. The data edit section 26 has, as functions for editing the pin-connection, a new connection function for newly connecting a stitch and a pad, a deletion function for deleting a connected wire, and a change function for canceling connection on the part of a pad or a stitch to perform connection to a new pad or stitch. The data edit section 26 then performs change of pin-connections using the above edit functions (S104) The assembly check section 24 checks edited design data, based on the rules file (S105). When an error is found (S105: Yes), the data edit is again performed (S104). When no error is found (S105: No), the data output section 25 outputs the result of the pin-connection (design data) to an external output unit (S106).

Next, the operations of the automatic pin-connection section in the LSI design support method of the present invention will be described in detail with reference to FIGS. 6, 7, and 9. FIG. 9 is a flowchart showing the operations of the automatic pin-connection section in the LSI design support method of the present invention.

The automatic pin-connection processing by the automatic pin-connection section 23 is performed separately for the package substrate region 51a and the chip substrate region 55a, the package substrate region 51b and the chip substrate region 55b, the package substrate region 51c and the chip substrate region 55c, and the package substrate region 51d and the chip substrate region 55d shown in FIG. 3. Described below is the automatic pin-connection processing of the package substrate region 51a and the chip substrate region 55a as an example. Here, description is given on a case where the pads 56 and the stitches 52 are sequentially connected.

First, the data acquisition section 40 acquires the read chip data, package data, and rules file. The processing below is performed based on these data and file. The end connection processing section 41-1 sets connection relations such that the pads 56-1 and 56-18 nearest to the corners (the ends) among the plurality of the pads 56 are connected to the stitches 52-1 and 52-12 nearest to the corners (the ends) among the plurality of the stitches 52, respectively (S01). With respect to the corners however, it may be possible to deal with only one of the corners. Next, the sequential equal processing section 41-2 acquires the distance Ls between the both ends of the line of the stitches 52, and the distance Lp between the both ends of the line of the pads 56 (S02). More in detail, the distance Ls is obtained from calculation using the coordinate at one end of the line of the stitches 52 and the coordinate at the other end. In the same way, the distance Lp is obtained from calculation using the coordinate at one end of the line of the pads 56 and the coordinate at the other end. The coordinates used at this time are the X-coordinate and the x-coordinate only.

Next, the sequential equal processing section 41-2, using the above equation (1), calculates the relative position ($S_{ratio}$) of one of the plurality of the stitches 52 which is nearest to a stitch with a connection relation already set and which is not the stitch 52-1 nearest to the corner (the end) (S03). For example, when the stitch with the connection relation already set is the stitch 52-1, the stitch 52 nearest thereto is the stitch 52-2. Therefore, $S_{ratio}(2)$, which is 9.4%, is to be obtained.

After that, the sequential equal processing section 41-2 calculates a corresponding position in the line of the pads 56, which corresponds to the relative position obtained at S03 (S04). For example, when the relative position $S_{ratio}(2)$, which is 9.4%, is obtained with respect to the stitch 52-2 at S03, the corresponding position 58-2 corresponding thereto in the line of the pads 56 is calculated by $Lp \times S_{ratio}(2)$.

Next, the sequential equal processing section 41-2 judges whether or not there is a vacant (with no connection relation being set) pad 56 which is nearest to the corresponding position obtained at S04 and which satisfies the assembly rules (S05). For example, when the corresponding position 58-2 of the stitch 52-2 is obtained at S04, the pad 56-3 can be considered as the vacant pad 56 nearest to the corresponding position 58-2. The pad 56-3 is judged whether to be vacant (whether no connection relation is set) and whether to satisfy the assembly rules when a connection relation is set. When the pad 56-3 is not vacant or when the pad 56-3 does not satisfy the assembly rules, the pad 56-2 is judged whether to be vacant as the nearest vacant pad 56.

When there is no appropriate nearest vacant pad (S05: NO), namely when the pads on both sides of the corresponding position 58 are not vacant or when the assembly rules are not satisfied when a connection relation is set, the sequential equal processing section 41-2 judges whether correction processing is possible or not (S06). The way of judging whether the correction processing is possible or not is explained later. For example, when the pads 56-3 and 56-2 are not vacant with respect to the corresponding position 58-2, the correction processing is judged whether to be possible or not. When the correction processing is possible (S06: YES), the pin-connection correction processing section 42 performs correction processing (S07). The correction processing is explained later.

After the pad 56 that corresponds to the stitch 52 is determined, the sequential equal processing section 41-2 sets a connection relation to connect those pad 56 and stitch 52 with the wire 53 (S08). That is, the stitch 52 is assigned to the pad 56. For example, when the appropriate nearest vacant pad 56-3 exists (S05: YES), the connection relation is set to connect that vacant pad 56-3 and the stitch 52-2 dealt with at S03, with the wire 53. That is, the stitch 52-2 is assigned to the pad 56-3. Similarly, a connection relation is set (explained later) to connect a pad 56a that is vacant as a result of correction (S07) and a stitch 52a with the wire 53. When the correction processing is not possible (S06: NO), the above stitch 52 is not connected to the pad 56.

The sequential equal processing section 41-2 judges whether S03 to S08 are completed for all the stitches 52 (S09). When S03 to S08 are not completed for all the stitches 52 (S09: NO), the above process is performed at the next stitch 52 by going back to S03. When S03 to S08 are completed for all the stitches 52 (S09: YES), the automatic pin-connection processing is completed.

Figure 10A:
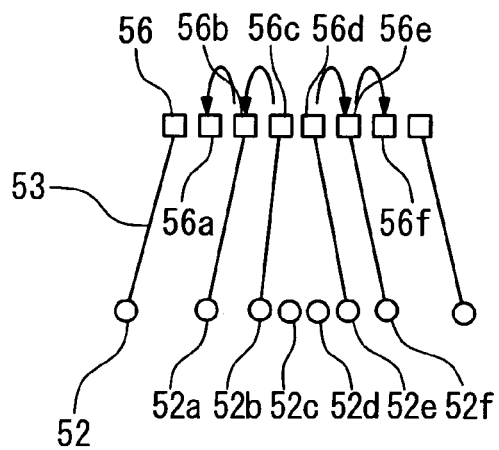
FIGS. 10A to 10C are schematic views showing connection relations concerning correction processing.
Figure 10B:
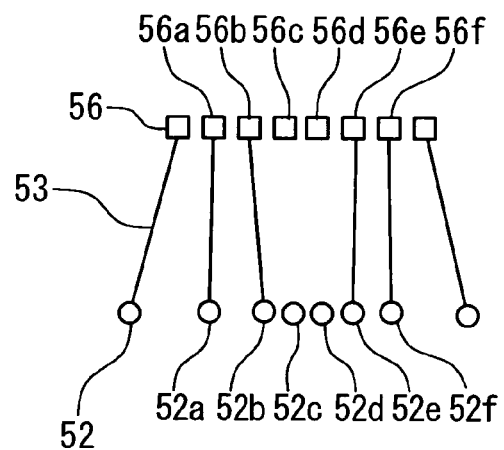
Figure 10C:
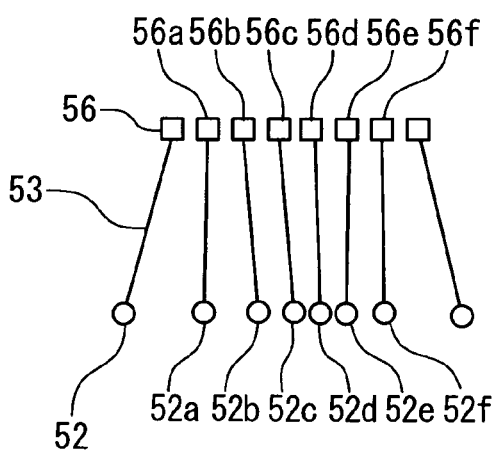

The judgment at S06 of whether correction processing is possible or not, and an example of correction processing at S07 will be explained next. FIGS. 10A to 10C are views showing schematic diagrams with respect to connection relations concerning correction processing.

FIG. 10A shows the state of S06 mentioned above, for example. At this time, the pads 56c and 56d in the corresponding relative positions of stitches 52c and 52d respectively, already have the setting of the connection relations with stitches 52b and 52e (connection with the wires 53), respectively. Therefore, under the assembly rules, the stitches 52c and 52d cannot have connection relations with the pads 56c and 56d, respectively. Here, there is a pad 56a to which a connection relation is not set, to one side from the pad 56c in the line of the pads 56. Similarly, there is a pad 56f to which a connection relation is not set, to the other side from the pad 56d. In this manner, it is possible to judge whether the correction processing of S06 is possible or not, by looking for a pad 56 to which a connection relation is not set, among the pads 56 positioned to the sides from a targeted pad 56.

When the correction processing is judged to be possible in FIG. 10A, it is possible to prepare a vacant pad in a desired position by shifting connection relations (shifting the wires 53) as shown in FIG. 10B. That is to say, the stitches 52c and 52d can have connection relations with the pads 56c and 56d, respectively, by changing (correcting) connection counterparts of the stitches 52a and 52b to the pads 56a and 56b and those of the stitches 52e and 52f to the pads 56e and 56f, respectively. By shifting connection relations one by one toward corners in the above manner, the correction processing of S07 can be performed.

After the correction processing is performed in FIG. 10B, the stitches 52c and 52d can be connected to the pads 56c and 56d, respectively, as shown in FIG. 10C, where the stitch 52c and the pads 56c, and the stitch 52d and the pad 56d each correspond in terms of relative positions. Thus it is possible to set desired connection relations at S08 by making corrections in connection relations.

With reference to FIGS. 10A to 10C, the operation in FIG. 9 more specifically is as explained below for instance. First, the connection relation between the stitch 52a and the pad 56b is set (S03, S04, S05: Yes, S08, and S09: Yes). Next, the connection relation between the stitch 52b and the pad 56c is set (S03, S04, S05: Yes, S08, and S09: Yes). At this time, the pad 56c suited to the stitch 52c is not vacant (S03, S04, and S05: No). For this reason, the line of the pads 56 is searched to judge whether correction is possible or not (S06). In this case, the pad 56a with no connection relation exists, to one side (where connection relations are already set) from the pad 56c. Therefore, it is judged that correction is possible (S06: Yes). The connection counterparts of the stitches 52a and 52b are shifted and changed to the pads 56a and 56b (S07). Consequently, it is possible to set a connection relation between the stitch 52c and the pad 56c, and the connection relation therebetween is set (S08). Such correction is performed from one corner toward the other corner in order, when the setting of connection relations between the stitches 52 and the pads 56 is performed from the one corner toward the other corner.

Additionally, FIGS. 10A to 10C show an example where the operations of the above correction processing are performed at approximately the same time in both regions of the left side and right side of the center (between the stitch 52c and pad 56c, and the stitch 52d and pad 56d) as a border.

Further, in the above embodiment, a corresponding position in the line of the pads 56, which corresponds to the relative position obtained at S03, is calculated at S04, and judgment is made at S05 whether there is a vacant pad 56 nearest to the corresponding position obtained at S04. However, it is also possible to firstly obtain the relative positions of the pads 56 at S04 by using the above equation (2), and compare at S05, the relative position of the stitch 52 obtained at S03 and that of the pad 56 obtained at S04 to judge whether the nearest vacant pad 56 exists or not.

Also, the automatic pin-connection processing is performed from one corner toward the other corner of the substrate here. However, with the methods explained below, it is also possible to perform the automatic pin-connection processing simultaneously from the both corners toward the center of a side, and simultaneously from the center of the side toward the both corners.

In the case of the processing to perform the automatic pin-connection processing simultaneously from the both corners toward the center of the side, the connection relation between a stitch and a pad nearest to one corner is firstly set with respect to a half of the stitches in the line, for example (S01). At the same time, the connection relation between a stitch and a pad nearest to the other corner is set with respect to the other half of the stitches (S01). Next, S02 to S09 are performed from the corner toward the center with respect to the half of the stitches. At the same time, S02 to S09 are performed from the other corner toward the center of the side with respect to the other half of the stitches.

In the case of the processing to perform the automatic pin-connection processing simultaneously from the center of the side toward the both corners, the connection relation between a stitch and a pad nearest to the corner is firstly set with respect to a half of the stitches in the line, for example (S01). At the same time, the connection relation between a stitch and a pad nearest to the corner is set with respect to the other half of the stitches (S01). Next, the connection relation between a stitch and a pad nearest to the center of the line is set with respect to the half of the stitches (S01'). At the same time, the connection relation between a stitch and a pad nearest to the center of the line is set with respect to the other half of the stitches (S01'). After that, S02 to S09 are performed from the center of the side toward the corner with respect to the half of the stitches. At the same time, S02 to S09 are performed from the center of the side toward the other corner with respect to the other half of the stitches.

In the case where the setting of the connection relations between the stitches 52 and the pads 56 is performed at approximately the same time from the both corners toward the center in the operations of FIG. 9 with reference to FIGS. 10A to 10C, the correction as mentioned above is correspondingly performed toward the center in the both regions sandwiching the center. In that case, the above operations can be performed by regarding the center as one corner. In the case where the setting of the connection relations between the stitches 52 and the pads 56 is performed at approximately the same time from the center toward the both corners, the correction is correspondingly performed toward the respective corners in the both regions sandwiching the center. In this case too, the above operations can be performed by regarding the center as one corner.

As a result, a stitch 52 can be automatically connected to an unconnected pad 56 with the relative position nearest to the relative position of the stitch 52. In this case, it is possible to automatically obtain connection meeting the assembly rules described in the rules file, since the stitch 52 and the pad 56 having approximately equivalent relative positions are connected. Consequently, it is possible to greatly reduce corrections in connection relations made by workers, and reduce the work burden, working man-hours, working time, and manufacturing time. It is also possible to improve an yield with the reduction in the manufacturing time.

Second Embodiment

In the first embodiment, the case is described, in which the automatic pin-connection section 23 sequentially connects the pads 56 and the stitches 52 with respect to the ASIC chip (LSI) of FIG. 3. In the second embodiment on the other hand, a case will be described, in which the automatic pin-connection section 23 collectively connects the pads 56 and the stitches 52 with respect to the ASIC chip (LSI) of FIG. 3.

The configurations of the LSI design support apparatus 1 and the automatic pin-connection section 23 of the second embodiment is the same as those of the first embodiment shown in FIGS. 2 and 4. Therefore, description on those configurations is omitted in the second embodiment.

Figure 11:
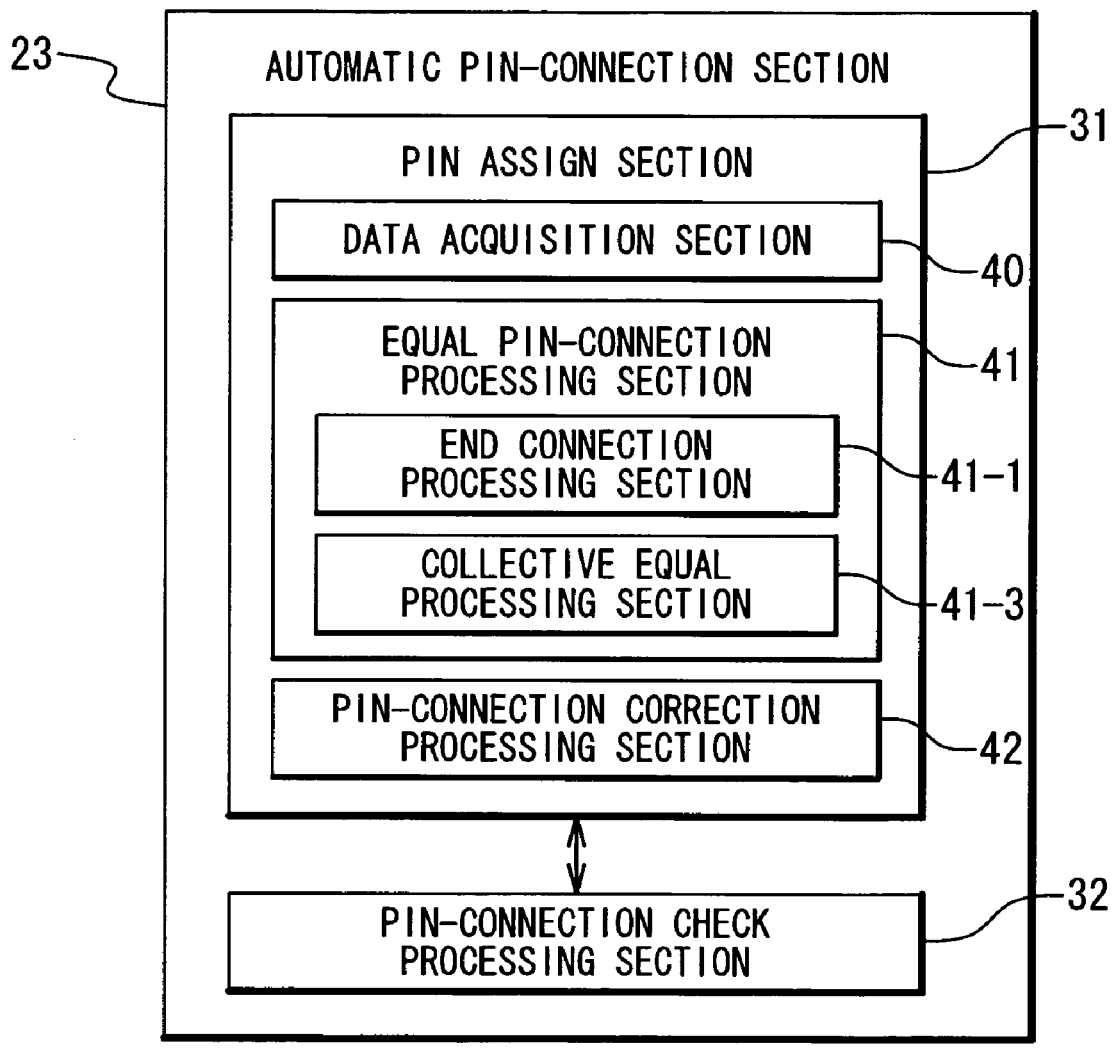
FIG. 11 is a block diagram showing a configuration of the automatic pin-connection section of FIG. 4 in the second embodiment.

FIG. 11 is a block diagram showing the structure of the automatic pin-connection section of FIG. 4 in the second embodiment. A pin assign section 31 of the automatic pin-connection section 23 includes a data acquisition section 40, an equal pin-connection processing section 41, and a pin-connection correction processing section 42.

The data acquisition section 40 acquires respective coordinates (X, Y) of a plurality of stitches 52 provided along one side of a package substrate 51, from read data. In addition, the data acquisition section 40 acquires respective coordinates (x, y) of a plurality of pads 56 provided along one side of a chip substrate 55. Here, the origin of the XY coordinates (stitch coordinates) concerning the package substrate 51 and the origin of the xy coordinates (pad coordinates) concerning the chip substrate 55 are each defined, and the relative positional relation between the both is also defined.

When the read data includes relative positions however, the data acquisition section 40 acquires respective relative positions of the plurality of the stitches 52 provided along the side of the package substrate 51. In addition, the data acquisition section 40 acquires respective relative positions of the plurality of the pads 56 provided along the side of the chip substrate 55. Here, the relative position shows relative positional relations of a plurality of electrodes (the stitches 52 and the pads 56) to each other.

The equal pin-connection processing section 41 calculates the respective relative positions of the plurality of the stitches 52, based on the respective coordinates of the plurality of the stitches 52. In the same way, the equal pin-connection processing section 41 obtains the respective relative positions of the plurality of the pads 56, based on the respective coordinates of the plurality of the pads 56. After that, the equal pin-connection processing section 41 sets connection relations between the plurality of the stitches 52 and the plurality of the pads 56 such that each of the plurality of the stitches 52 is connected to one of the plurality of the pads 56 having relative position nearest to the relative position of the each stitch 52. The equal pin-connection processing section 41 has an end connection processing section 41-1 and a collective equal processing section 41-3.

The end connection processing section 41-1 sets a connection relation between a stitch 52 at an end among the plurality of the stitches 52 and a pad 56 at an end among the plurality of the pads 56, to connect that stitch 52 at the end to that pad 56 at the end.

The collective equal processing section 41-3 sets connection relations between the plurality of the stitches 52 and the plurality of the pads 56, to each connect the stitches 52 to the pads 56 having relative positions nearest to the relative positions of the stitches 52, where the stitches 52 are not the stitch at the end and the pads 56 are not the pad at the end. At this time, the assembly rules are temporarily ignored.

When a connection relation set by the equal pin-connection processing section 41 is not appropriate, the pin-connection correction processing section 42 performs correction processing to make the connection relation have an appropriate state (which meets the assembly rules concerning wiring such as double connection, wire lengths, wire angles, and intersection rules). For example, when a pad 56 suited to a certain stitch 52 has a connection relation already set, all of or part of adjacent connection relations are shifted toward the pad 56 at the end, to vacate the connection relation of the pad 56 suited to the certain stitch 52. When a connection relation between a certain stitch 52 and a certain pad 56 does not satisfy predetermined conditions for example, part of connection relations already set concerning the plurality of the stitches 52 and the plurality of the pads 56 are shifted toward the stitch 52 at the end or the pad 56 at the end such that the connection relations do not overlap each other.

The example of the coordinates shown in FIG. 6 and the example of the relative positions shown in FIG. 7 of the second embodiment are the same as those of the first embodiment. Therefore, description on those examples is omitted in the second embodiment.

The operations of the LSI design support method of the present invention shown in FIG. 8 of the second embodiment are the same as those of the first embodiment. Therefore, description on those operations is omitted in the second embodiment.

Figure 12:
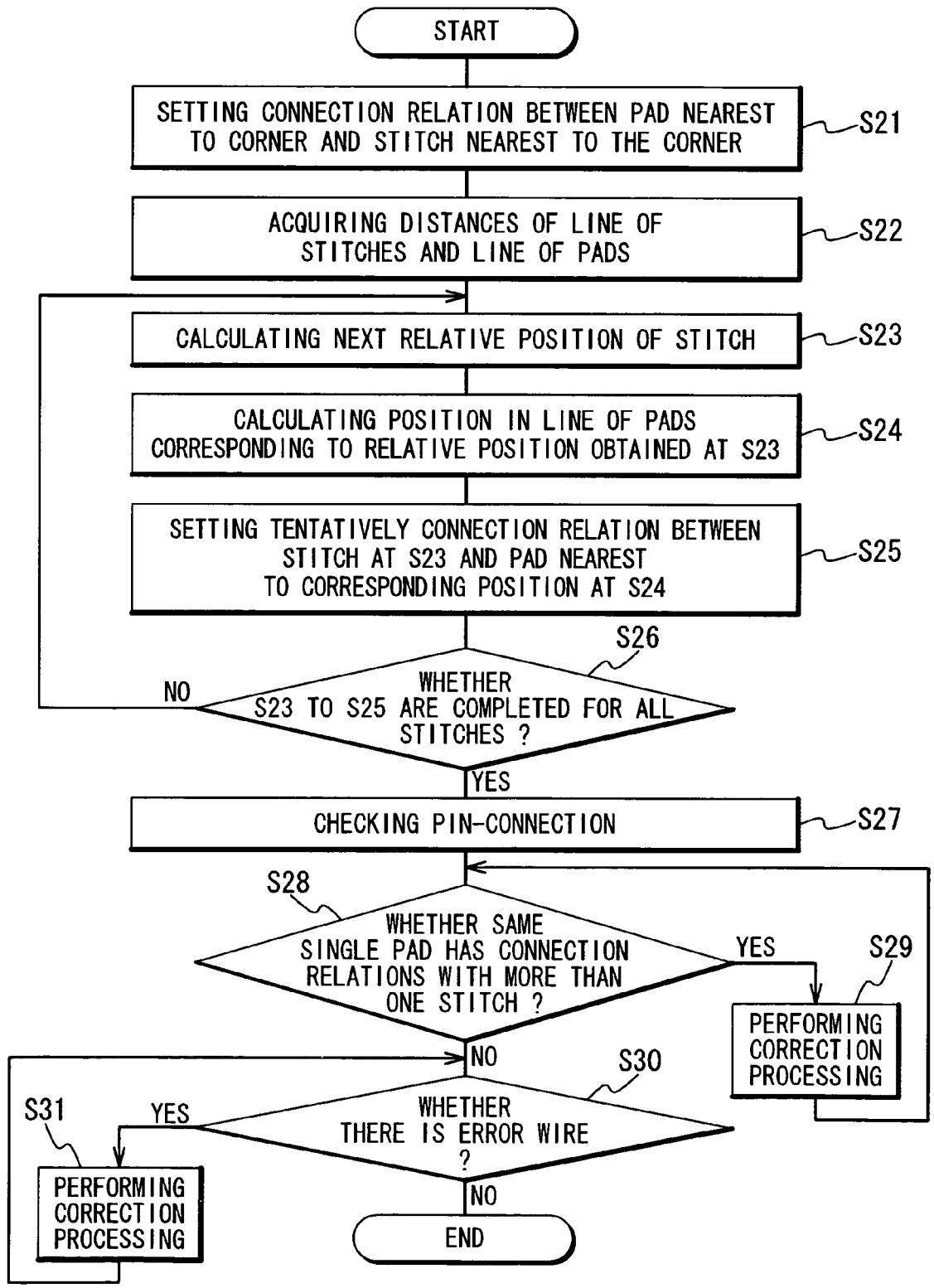
FIG. 12 is a flowchart showing operations of the automatic pin-connection section in the LSI design support method of FIG. 7.

Next, the operations of the automatic pin-connection section in the LSI design support method of the present invention will be described with reference to FIGS. 6, 7, and 12. FIG. 12 is a flowchart showing the operations of the automatic pin-connection section in the LSI design support method of FIG. 7.

Automatic pin-connection processing by the automatic pin-connection section 23 is separately performed for the package substrate region 51$a$ and the chip substrate region 55$a$, the package substrate region 51$b$ and the chip substrate region 55$b$, the package substrate region 51$c$ and the chip substrate region 55$c$, and the package substrate region 51$d$ and the chip substrate region 55$d$ shown in FIG. 3. Description is hereinafter given on the automatic pin-connection processing of the package substrate region 51$a$ and the chip substrate region 55$a$ as an example. Here, description is given on a case where the pad 56 and the stitch 52 are collectively connected.

First, the data acquisition section 40 acquires read chip data, package data, and rules file. The processing below is performed based on these data and file. The end connection processing section 41-1 sets connection relations to connect the pads 56-1 and 56-18 nearest to the corners (the ends) among the plurality of the pads 56, to the stitches 52-1 and 52-12 nearest to the corners (the ends) among the plurality of the stitches 52, respectively (S21). With respect to the corners however, it may be possible to deal with only one of the corners. Next, the sequential equal processing section 41-2 acquires a distance Ls between the both ends of the line of the plurality of the stitches 52, and a distance Lp between the both ends of the line of the plurality of the pads 56 (S22). More in detail, the distance Ls is obtained from calculation using the coordinates at one end of the line of the plurality of the stitches 52 and the coordinates at the other end. In the same way, the distance Lp is obtained from calculation using the coordinates at one end of the line of the plurality of the pads 56 and the coordinates at the other end. The coordinates used at this time are the X-coordinate and the x-coordinate only.

Next, the collective equal processing section 41-3, using the above-mentioned equation (1), calculates the relative position ($S_{ratio}$) of one of the plurality of the stitches 52 which is nearest to a stitch 52 with a connection relation already set and which is not the stitch 52-1 nearest to the corner (the end) (S23). For example, when the stitch with the connection relation already set is the stitch 52-1, the stitch 52 nearest thereto is the stitch 52-2. Therefore, $S_{ratio}(2)$, which is 9.4%, is to be obtained.

After that, the collective equal processing section 41-3 calculates a corresponding position in the line of the plurality of the pads 56, which corresponds to the relative position obtained at S23 (S24). For example, when the relative position $S_{ratio}(2)$, which is 9.4%, is obtained with respect to the stitch 52-2 at S23, the corresponding position 58-2 corresponding thereto in the line of the plurality of the pads 56 is calculated by $Lp \times S_{ratio}(2)$.

Next, the collective equal processing section 41-3 tentatively sets the connection relation between the stitch 52 of S23 and a pad 56 nearest to the corresponding position obtained at S24, irrespective of whether or not that pad 56 obtained at S24 is vacant (whether or not to meet the assembly rules concerning wiring such as double connection, wire lengths, wire angles, and intersection rules) (S25). That is, the pad 56 nearest to the corresponding position obtained at S24 is tentatively assigned to the stitch 52 obtained at S23. For example, when the corresponding position 58-2 of the stitch 52-2 is obtained at S24, the vacant pad 56 nearest to the corresponding position 58-2 is the pad 56-3. The collective equal processing section 41-3 tentatively sets the connection relation between the stitch 52-2 and the pad 56-3, whether the pad 56-3 is vacant or not (whether or not a connection relation is already set to the pad 56-3). That is, the pad 56-3 is tentatively assigned to the stitch 52-2.

The collective equal processing section 41-3 judges whether S23 to S25 are completed for all the stitches 52 (S26). When S23 to S25 are not completed for all the stitches 52 (S26: NO), the above process is performed at the next stitch 52 by going back to S23. When S23 to S25 are completed for all the stitches 52 (S26: YES), the pin-connection check processing section 32 checks whether or not the assembly rules described in the rules file are satisfied with respect to the connection relations tentatively set between the plurality of the stitches 52 and the plurality of the pads 56 (S27).

The pin-connection check processing section 32 judges whether or not the same single pad 56 has connection relations with more than one stitch 52. When the same single pad 56 has connection relations with more than one stitch 52 (S28: YES), the pin-connection correction processing section 42 performs first correction processing, which is one correction processing (S29). Description on the first correction processing is given later.

After all the necessary first correction processing is completed, the pin-connection check processing section 32 judges whether there is an error wire (errors in connection relations) that does not satisfy the given assembly rules concerning wiring such as wire lengths, wire angles, and intersection rules (S30). When there is an error wire that does not satisfy the given assembly rules (S30: YES), the pin-connection correction processing section 42 performs second correction processing, which is one correction processing (S31). Description on the second correction processing is given later.

After all the necessary second correction processing is completed, the automatic pin-connection processing is completed.

Figure 13A:
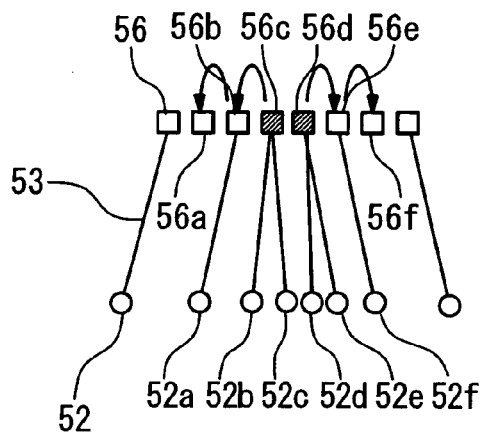
FIGS. 13A and 13B are schematic views showing the first correction processing.
Figure 13B:
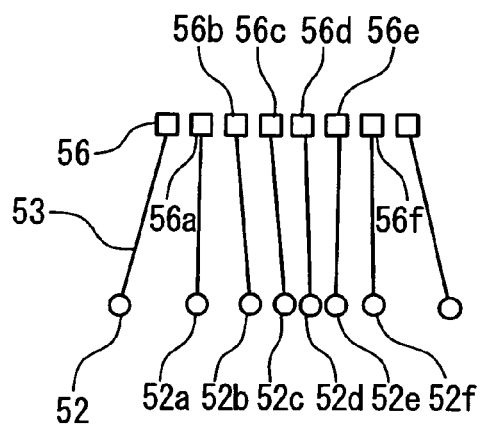

Next, an example will be described, in which the assembly rules are not satisfied, and the first correction processing correspondingly performed at S29. FIGS. 13A to 13B are schematic diagrams showing an example of the first correction processing.

FIG. 13A shows the state of YES at S28, for example. At this time, the same single pad 56c has the connection relations (connected with the wires 53) with the two stitches 52b and 52c. Similarly, the single pad 56d has the connection relations (connected with the wires 53) with the two stitches 52d and 52e. That is to say, the connection relations overlap in the case of the pads 56c and 56d. The first correction processing is then required since it is not allowed to connect a same single pad 56 to more than one stitch with the wire 53. Here, there is the pad 56a, in which a connection relation is not set, to one side from the pad 56c in the line of the pads 56. Similarly, there is the pad 56f, in which a connection relation is not set, to the other side from the pad 56d. Therefore, it is possible to correct connection relations to connect a single pad 56 to a single stitch 52, by shifting connection relations (shifting the wires 53).

FIG. 13B shows the state where the first correction processing is performed at S29. That is, the connection counterparts of the stitches 52a and 52b are changed (corrected) to the pads 56a and 56b, respectively, and the connection counterparts of the stitches 52e and 52f are changed (corrected) to the pads 56e and 56f, respectively. Consequently, the connection relations involving the pads 56c and 56d do not overlap any more, making it possible to set desired connection relations.

With reference to FIGS. 13A and 13B, S21 to S29 in FIG. 12 are more specifically as explained below for example. First, the connection relations between the stitches 52a to 52f and the pads 56b to 56e are set (S21 to S26). Next, the pin-connection is checked (S27), and it is examined whether there is a same single pad 56 connected to more than one stitch 52 (S28). In this case, the stitches 52b and 52c have the connection relations with the same single pad 56c (S28: YES). Therefore, a vacant pad 56 is searched for in the line of the pads 56 (S29-1: not shown). In this case, the pad 56a with no connection relation set exists to one side from the pad 56c. Therefore, the connection counterparts of the stitches 52a and 52b are shifted to the pads 56a and 56b (S29-2: not shown). Consequently, it is possible to set an appropriate connection relation between the stitch 52c and the pad 56c, and the connection relation therebetween is set (S29-3: not shown). When the correction processing of the setting of the connection relations between the stitches 52 and the pads 56 is performed from one corner toward the other corner, the above correction is performed in order from the one corner to the other corner.

Additionally, FIGS. 13A and 13B show the example where the operations of the above correction processing are performed at approximately the same time in both the left and right regions with the center (between the stitch 52c and pad 56c, and the stitch 52d and pad 56d) as a border.

Figure 14A:
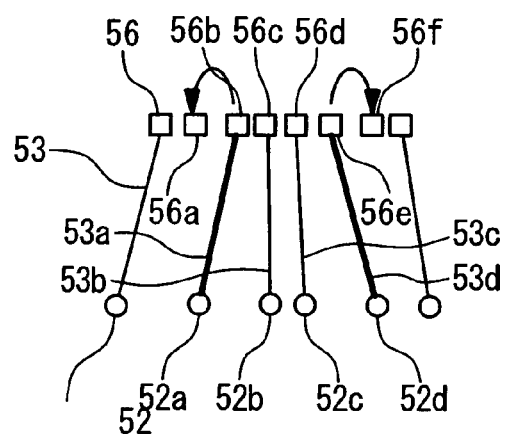
FIGS. 14A and 14B are schematic views showing the second correction processing.
Figure 14B:
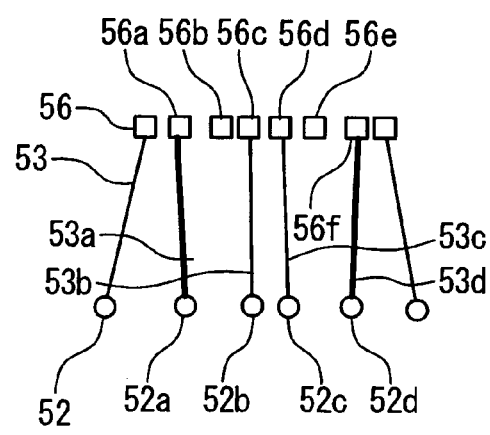

Next, another example will be described, in which the assembly rules are not satisfied, and the second correction processing correspondingly performed at S31. FIGS. 14A and 14B are schematic diagrams showing an example of the second correction processing.

FIG. 14A shows the state of YES at S30, for example. Here, an example is shown where a wire 53a connecting the stitch 52a and the pad 56b, and a wire 53d connecting the stitch 52d and the pad 56e do not satisfy allowed wire angles as one of the given assembly rules. In other words, the wires 53a and 53d have errors concerning connection relations. Here, the pad 56a with no connection relation set, exists to one side from the pad 56c in the line of the pads 56. Similarly, the pad 56f with no connection relation set, exists to the other side from the pad 56d. Therefore, it is possible to correct connection relations to solve errors in connection relations, by shifting the connection relations (shifting the wires 53).

FIG. 14B shows the state where the second correction processing is performed at S31. That is, the connection counterparts of the stitches 52a and 52d are changed (corrected) to the pads 56a and 56f, respectively. Consequently, errors in the connection relations in the wires 53a and 53d are solved, making it possible to set desired connection relations.

With reference to FIGS. 14A and 14B, S30 to S31 in FIG. 12 more specifically are as explained below for example. The connection relations between the stitches 52a to 52d and the pads 56b to 56e are set not to connect more than one stitch 52 to the single pad 56 (S28 to S29). The pin-connection is checked, to examine whether there is an error wire that does not satisfy the assembly rules other than S28 (S30). In this case, the wire 53a (the stitch 52a—the pad 56b) does not satisfy the wire angles (S30: YES). For this reason, a vacant pad 56 is searched for in the line of the pads 56 (S31-1: not shown). In this case, the pad 56a with no connection relation set, exists to the one side from the pad 56c. Therefore, the connection counterpart of the stitch 52a is shifted to the pad 56a (S31-2: not shown). As a result, the wire 53a (the stitch 52a—the pad 56a) satisfies the wire angles, and the setting is performed (S31-3: not shown). When the correction processing of the setting of the connection relations between the stitches 52 and the pads 56 is performed from one corner toward the other corner, the above correction is performed in order from the one corner toward the other corner.

Additionally, FIGS. 14A and 14B show the example where the operations of the above correction processing are performed at approximately the same time in both the left and right regions with the center (between the stitch 52c and pad 56c, and the stitch 52d and pad 56d) as a border.

In the above embodiment, a corresponding position in the line of the plurality of the pads 56, which corresponds to the relative position obtained at S23, is calculated at S24, and it is judged at S25 whether there is a vacant pad 56 nearest to the corresponding position obtained at S24. It is also possible however, to firstly obtain the relative positions of the plurality of the pads 56 at S24 by using the above equation (2), and compare at S25 the relative position of the stitch 52 obtained at S23 with the relative position of the pad 56 obtained at S24 to judge whether there is a nearest vacant pad 56.

Here, the automatic pin-connection processing is performed from one corner toward the other corner of the substrate. With the above method however, it is also possible to perform the automatic pin-connection processing simultaneously from both corners toward the center of a side, and from the center of the side toward the both corners.

In the case of the processing to perform the automatic pin-connection processing simultaneously from the both corners toward the center of the side, the connection relation between a stitch and a pad nearest to corner is set with respect to a half of the stitches in a line, for example (S21). At the same time, the connection relation between a stitch and a pad nearest to the other corner is set with respect to the other half of the stitches (S21). Next, S21 to S25 are performed from the corner toward the center of the side with respect to the half of the stitches. At the same time, S21 to S25 are performed from the other corner toward the center of the side with respect to the other half of the stitches.

In the case of the processing to perform the automatic pin-connection processing simultaneously from the center of the side toward the both corners, the connection relation between a stitch and a pad nearest to the corner is set with respect to a half of the stitches in a line, for example (S21). At the same time, the connection relation between a stitch and a pad nearest to the other corner is set with respect to the other half of the stitches (S21). Next, the connection relation between a stitch and a pad nearest to the center is set with respect to the half of the stitches (S21'). At the same time, the connection relation between a stitch and a pad nearest to the center is set with respect to the other half of the stitches (S21'). After that, S22 to S25 are performed from the center of the side toward the corner with respect to the half of the stitches. At the same time, S22 to S25 are performed from the center of the side toward the other corner with respect to the other half of the stitches.

When the setting of the connection relations between the stitches 52 and the pads 56 is performed at approximately the same time from the both corners toward the center in the operations of FIG. 12 referring to FIGS. 13A, 13B, 14A and 14B, the correction is correspondingly performed toward the center in the both regions sandwiching the center. In that case, the above operations can be performed by regarding the center as one corner. When the setting of the connection relations between the stitches 52 and the pads 56 is performed at approximately the same time from the center toward the both corners, the correction is correspondingly performed toward the both corners in the both regions sandwiching the center. In that case too, it is possible to perform the above operations by regarding the center as one corner.

As a result, it is possible to automatically connect a stitch 52 to an unconnected pad 56 having a relative position nearest to the relative position of the stitch 52 and satisfying the assembly rules described in the rules file. Consequently, it is possible to greatly reduce corrections in connection relations made by workers, and reduce the work burden, working manhours, working time, and manufacturing time. It is also possible to improve an yield with the reduction in the manufacturing time.

Third Embodiment

In the first and second embodiments, the case is described, in which the automatic pin-connection section 23 connects the pads 56 and the stitches 52 with respect to the ASIC chip (LSI) having a single line of the pads and a single line of the stitches shown in FIG. 3. In the third embodiment, a case will be described, in which the automatic pin-connection section 23 connects the pads 56 and the stitches 52 with respect to an ASIC chip (LSI) having two lines of pads and two lines of stitches shown in FIG. 15 (mentioned later).

The configurations of the LSI design support apparatus 1 and the automatic pin-connection section 23 of the present invention shown in FIGS. 2 and 4 of the third embodiment are the same as those of the first embodiment. Therefore, description on those configurations is omitted in the third embodiment.

Figure 15:
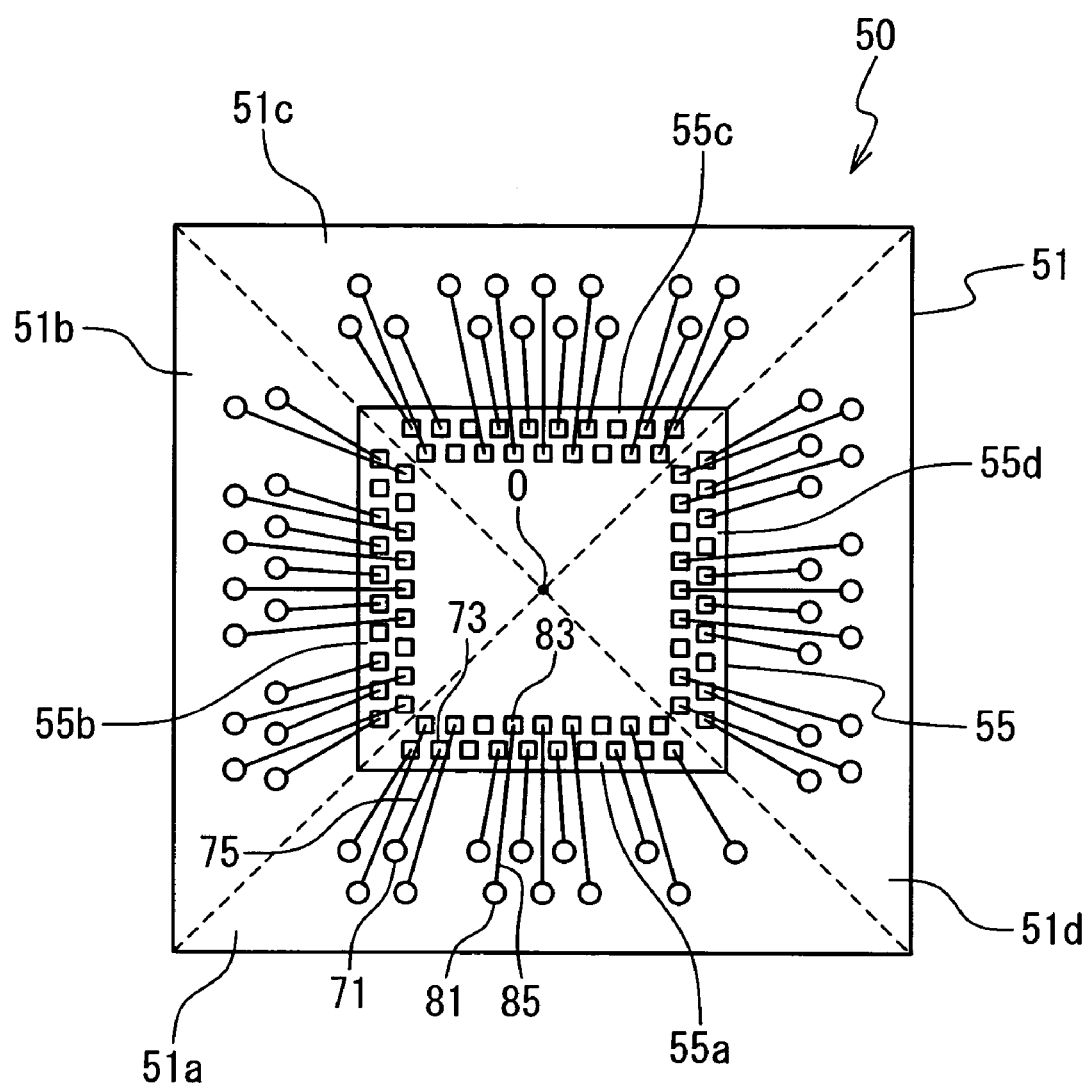
FIG. 15 is a schematic view showing an ASIC chip designed by the LSI design support apparatus of the present invention.

FIG. 15 is a schematic view showing an ASIC chip (LSI) designed by the LSI design support apparatus of the present invention. The ASIC chip 50 has a package substrate 51 of an LSI package and a chip substrate 55 of a chip. The package substrate 51 and the chip substrate 55 are divided into four regions by imaginary diagonal lines. The four regions are: a package substrate region 51a and a chip substrate region 55a; a package substrate region 51b and a chip substrate region 55b; a package substrate region 51c and a chip substrate region 55c; and a package substrate region 51d and a chip substrate region 55d. Each of the four regions has the same structure, arranged in different directions. For this reason, the package substrate region 51a and the chip substrate region 55a are explained below as examples of the package substrate S and the chip substrate 55, respectively.

The package substrate 51 includes a plurality of stitches 71 and a plurality of stitches 81 along a side of the package substrate 51. The chip substrate 55 includes a plurality of pads 73 and a plurality of pads 83 along a side of the chip substrate 55. Here, the stitches 81 are provided farther than the stitches 71 from the side of chip substrate 55. The pads 83 are provided farther than the pads 73 from the side of the package substrate 51. In other words, a line of the stitches 81 and that of the pads 83 are provided to sandwich a line of the stitches 71 and that of the pads 73. In the ASIC chip 50, the coordinates of the pads 73 and 83 and those of the stitches 71 and 81 are determined in advance, prior to pin-connection processing. Each of the numbers of the pads 73 and 83 is usually larger than each of the numbers of the stitches 71 and 81 (which correspond to external pins). Each of the plurality of the stitches 71 is connected to one of the plurality of the pads 73 with a wire 75. Similarly, each of the plurality of the stitches 81 is connected to one of the plurality of the pads 83 with a wire 85. The LSI design support apparatus of the present invention creates design data 3 of the ASIC chip (LSI) 50 having the two lines of the pads and the two lines of the stitches as mentioned above.

Figure 16:
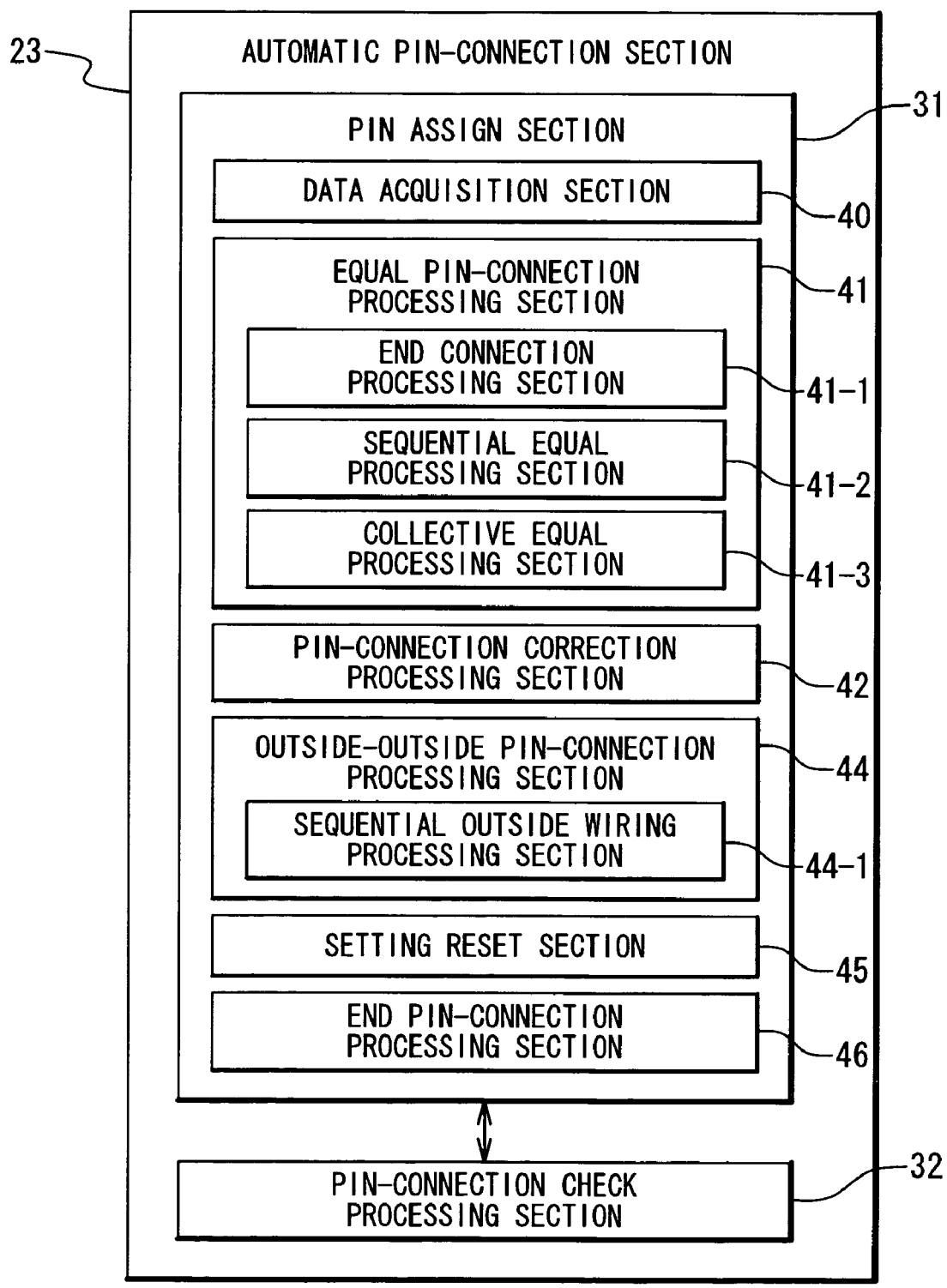
FIG. 16 is a block diagram showing a configuration of the automatic pin-connection section of FIG. 4 in the third embodiment.

FIG. 16 is a block diagram showing a configuration of the automatic pin-connection section of FIG. 4 in the third embodiment. A pin assign section 31 of an automatic pin-connection section 23 includes a data acquisition section 40, an equal pin-connection processing section 41, a pin-connection correction processing section 42, an outside-outside pin-connection processing section 44, a setting reset section 45, and an end pin-connection processing section 46. The equal pin-connection processing section 41 includes an end connection processing section 41-1, a sequential equal processing section 41-2, and a collective equal processing section 41-3.

Among the above sections, the data acquisition section 40, the equal pin-connection processing section 41 (including the end connection processing section 41-1, the sequential equal processing section 41-2, and the collective equal processing section 41-3), and the pin-connection correction processing section 42 of the third embodiment are the same as those of the first and second embodiments. Therefore, description on these sections and parts is omitted in the third embodiment. However, the equal pin-connection processing section 41 performs the setting of connection relations between the plurality of the stitches 71 and the plurality of the pads 73.

The outside-outside pin-connection processing section 44 sets connection relations between the plurality of the stitches 81 and the plurality of the pads 83 such that each of the plurality of the stitches 81 is connected to one of the plurality of the pads 83 that satisfies the assembly rules and is nearest to a corner. The outside-outside pin-connection processing section 44 has a sequential outside wiring processing section 44-1.

The sequential outside wiring processing section 44-1 sets a connection relation between stitches 81 and pads 83 such that a stitch 81 nearest to a corner (or an end) among the stitches 81 with no connection relations being set is connected to a pad 83 which satisfies the assembly rules and is nearest to a corner (or an end) among the plurality of the pads 83. The sequential outside wiring processing section 44-1 performs the setting of such connection relations in order starting from the stitch 81 at the corner (or the end) among the plurality of the stitches 81.

The setting reset section 45 resets (cancels) a given connection relation between the stitches 81 and the pads 83 and a given connection relation between the stitch 71 and the pad 73, when errors occur in the setting of connection relations by the outside-outside pin-connection processing section 44.

The end pin-connection processing section 46 sets connection relations such that the stitch 81 and the pad 83 both nearest to the corners among the stitches 81 and the pads 83 of which connection relations have been reset by the setting reset section 45 are connected, and the stitch 71 and the pad 73 both nearest to the corners among the stitches 71 and the pads 73 of which connection relations have been reset by the setting reset section 45 are connected.

Figure 17:
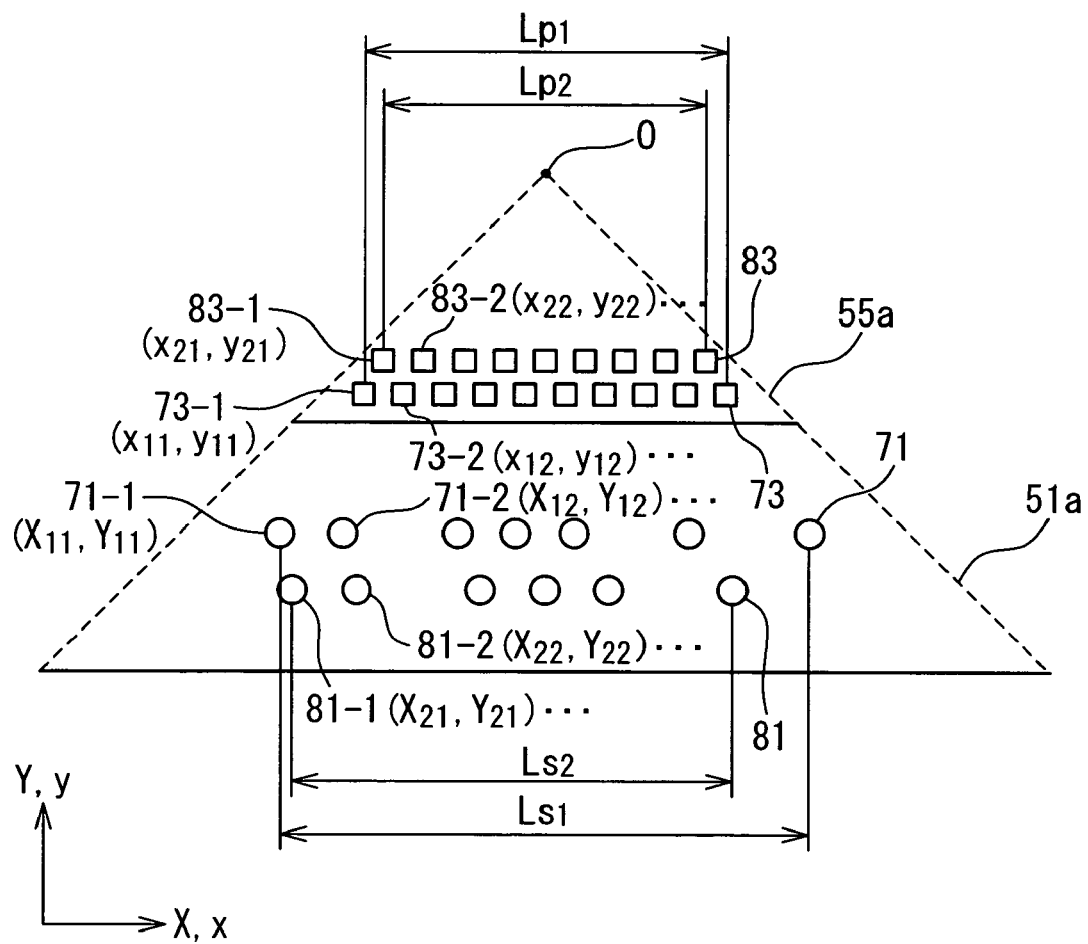
FIG. 17 is a schematic view showing an example of coordinates of each electrode.

FIG. 17 is a schematic view showing an example of coordinates of each electrode. The direction parallel to the sides of the package substrate 51 and the chip substrate 55 is the X-axis and the x-axis, while the direction vertical thereto is the Y-axis and the y-axis. In FIG. 17, the seven stitches 71 and the six stitches 81 are provided to one side of the package substrate 51 in approximately a straight line, and the ten pads 73 and the nine pads 83 are provided to one side of the chip substrate 55 in approximately a straight line. In a line of the stitches 71 for example, the coordinates of the leftmost stitch 71-1 are $(X_{11}, Y_{11})$, the coordinates of the next stitch 71-2 are $(X_{12}, Y_{12})$, and so forth. In a line of the stitches 81, the coordinates of the leftmost stitch 81-1 are $(X_{21}, Y_{21})$, the coordinates of the next stitch 81-2 are $(X_{22}, Y_{22})$, and so forth. Similarly, in a line of the pads 73, the coordinates of the leftmost pad 73-1 are $(x_{11}, y_{11})$, the coordinates of the next pad 73-2 are $(x_{12}, y_{12})$, and so forth. In a line of the pads 83, the coordinates of the leftmost pad 83-1 are $(x_{21}, y_{21})$, the coordinates of the next pad 83-2 are $(x_{22}, y_{22})$, and so forth.

In this case of the pin-connection processing, the stitch 71 and the pad 73 are connected and the stitch 81 and the pad 83 are connected. That pin-connection processing deals with only the X-coordinate and the x-coordinate of each electrode in respective lines. Consequently, no problems occur in dealing with the line of the pads 73 and the line of the pads 83 provided in approximately a straight line, even when the line of the stitches 71 and the line of the stitches 81 are provided in approximately an arc form or not in parallel to each other. However, the X-coordinate and the Y-coordinate, and the x-coordinate and the y-coordinate are used for the verification of the connections based on the assembly rules and so on.

The way of understanding the relative positions shown in FIG. 7 is applicable to the third embodiment in the same way as the first embodiment, where the relations between the stitches 52 and the pads 56 correspond to the relations between the stitches 71 and the pads 73, and the relations between the stitches 81 and the pads 83.

The operations of the LSI design support method of the present invention shown in FIG. 8 of the third embodiment are the same as those of the first embodiment and. Therefore, description on those operations is omitted in the third embodiment.

Figure 18:
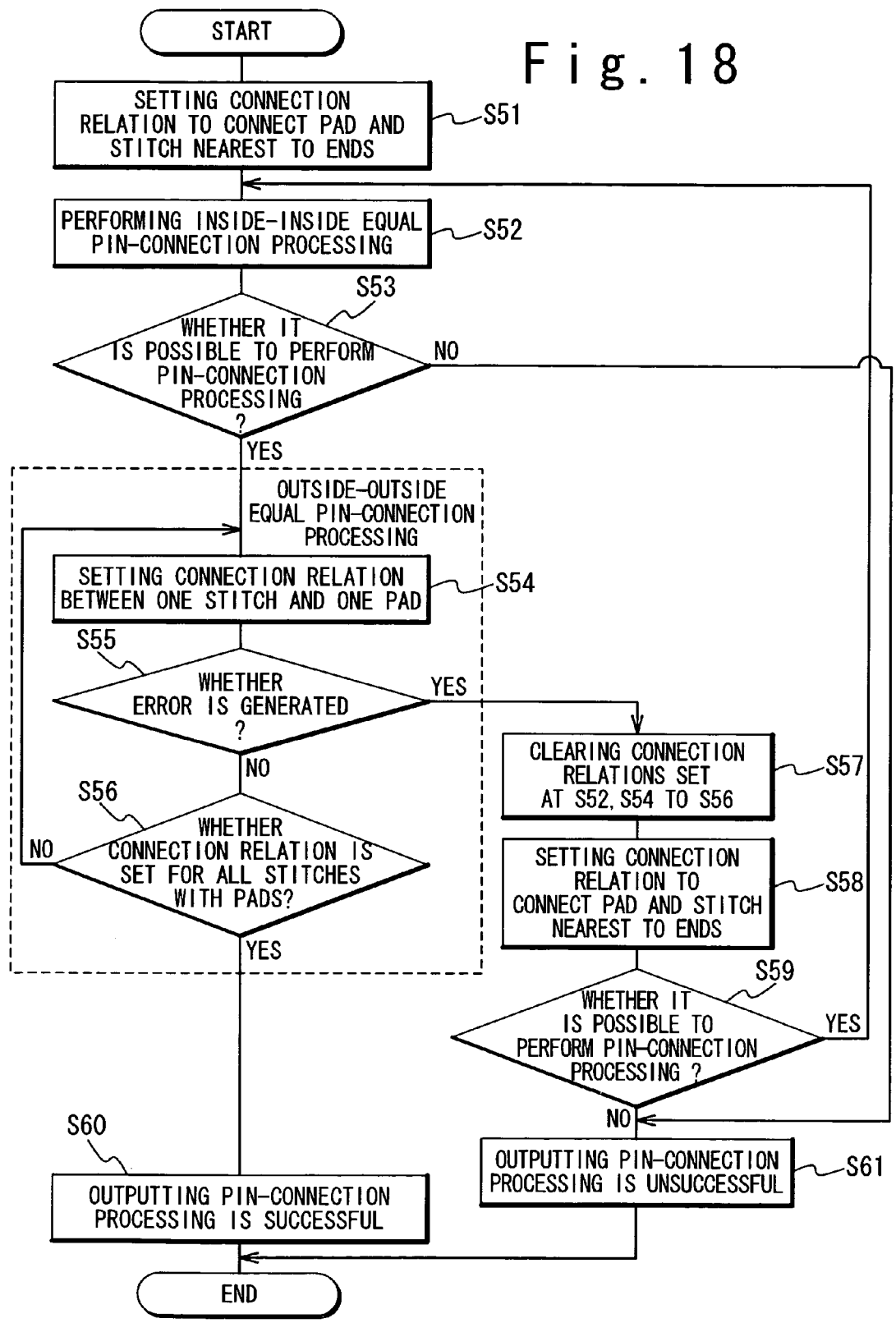
FIG. 18 is a flowchart showing operations of the automatic pin-connection section in the LSI design support method of FIG. 7.

Next, the operations of the automatic pin-connection section in the LSI design support method of the present invention will be described with reference to FIGS. 15, 17, and 18. FIG. 18 is a flowchart showing the operations of the automatic pin-connection section in the LSI design support method of FIG. 8. Automatic pin-connection processing by the automatic pin-connection section 23 is performed separately for the package substrate region 51a and the chip substrate region 55a, the package substrate region 51b and the chip substrate region 55b, the package substrate region 51c and the chip substrate region 55c, and the package substrate region 51d and the chip substrate region 55d. Description is given hereinafter on the automatic pin-connection processing of the package substrate region 51a and the chip substrate region 55a as an example.

When the arrangement of the pads and that of the stitches are hound's tooth pads and hound's tooth stitches, respectively as shown in FIG. 15, the assembly rules provides that the inside stitches 71 should be connected to the outside pads 73 and the outside stitches 81 should be connected to the inside pads 83. Therefore, inside-inside equal pin-connection processing (sequential or collective equal processing) is firstly performed for the inside stitches 71 and the outside pads 73. After that, outside-outside pin-connection processing (sequential outside wiring processing) is performed for the outside stitches 81 and the inside pads 83.

Here, in a group of the lines of the stitches 81, stitches 71, the pads 73 and the pads 83, the lines of the stitches 71 and pads 73 seem to be placed inside. Therefore, here, the "inside-inside" is related to the stitches 71 and pads 73. Similarly, in the group, the lines of the stitches 81 and pads 83 seem to be placed outside. Therefore, here, the "outside-outside" is related to the stitches 81 and pads 83.

First, the data acquisition section 40 acquires read chip data, package data, and rules file. The processing below is performed based on these data and file. The end connection processing section 41-1 sets a connection relation such that the pad 73-1 nearest to the corner (the end) among the plurality of the pads 73 is connected to the stitch 71-1 nearest to the corner (the end) among the plurality of the stitches 71 (S51). Next, the following S52 is performed as the inside-inside equal pin-connection processing. The sequential equal processing section 41-2 and the pin-connection correction processing section 42 perform S02 to S09 mentioned in the first embodiment for the remaining pads 73 and stitches 71 to which connection relations are not set. Consequently, the connection relations between the plurality of the pads 73 and the plurality of the stitches 71 are set (S52). Here, it may be also possible with respect to S52, that the collective equal processing section 41-3, the pin-connection correction processing section 42, and a second pin-connection correction processing section 43 perform S22 to S31 mentioned in the second embodiment for the remaining pads 73 and stitches 71 to which connection relations are not set. This alternative also makes it possible to set the connection relations between the plurality of the pads 73 and the plurality of the stitches 71.

The pin-connection check processing section 32 judges whether or not errors are made in connections between the plurality of the pads 73 and the plurality of the stitches 71 at the stage of the inside-inside equal pin-connection processing (S53). That is, it judges whether or not it is possible to perform pin-connection processing (set a connection between a pads 73 and a stitch 71). When an error is found (S53: NO), it is judged that the pin-connection is impossible, and S61 is followed. When no error is found (S53: YES), it is judged that pin-connection operation can be continued.

The sequential outside wiring processing section 44-1 performs the following S54 to S56 as the outside-outside equal pin-connection processing. First, a connection relation between a stitch 81 and a pad 83 is set such that a stitch 81 nearest to the corner (or the end) among the plurality of the stitches 81 with no connection relations being set is connected to a pad 83 which satisfies the assembly rules (exemplified by the rules concerning double connection, wire lengths, wire angles, and so on) and is nearest to the corner (or the end) among the plurality of the pads 83 (S54). Next, the sequential outside wiring processing section 44-1 judges whether or not the connection relation at S54 has been set and no error is generated (S55). When the connection relation at S54 has been set and no error is generated (S55: NO), it is judged whether or not the connection relations have been set for all the stitches 81 with the pads 83 (S56). When there is a stitch 81 with no connection relation being set (S56: NO), the process is repeated by returning to S55. When there is no stitch 81 with no connection relation being set (S56: YES), S60 is followed.

When the connection relation at S54 cannot be set and errors are generated (S55: YES), the setting reset section 45 clears (cancels) the connection relations between all the stitches 81 and the pads 83 set at S54 to S56, and the connection relations between all the stitches 71 and the pads 73 set at S52 (excluding however, a connection relation between a stitch 71 and a pad 73 for which S58 has been performed) (S57). After that, the end pin-connection processing section 46 sets a connection relation such that a stitch 71 nearest to the corner (the end) is connected to a pad 73 which satisfies the assembly rules and is nearest to the corner among the stitches 71 and the pads 73 excluding stitches 71 and pads 73 having connection relations set at S51 and formerly at S58 (S58). That is, it judges whether or not it is possible to perform pin-connection processing (set a connection between a pads 73 and a stitch 71). Next, the end pin-connection processing section 46 judges whether or not the connection relation at S58 has been set (S59). When the connection relation at S58 has been set (S59: YES), the process proceeds by returning to S52. When the connection relation at S58 cannot be set (S59: NO), S61 is followed.

When the setting of the connection relations between all the stitches 71 and the pads 73 and the connection relations between all the stitches 81 and the pads 83 is successful, the success is displayed on a display unit (S60). When any of settings of the connection relations between the stitches 71 and the pads 73 and the connection relations between the stitches 81 and the pads 83 fails, the failure is displayed on the display unit (S61). After that, the automatic pin-connection processing is completed.

The setting of a connection relation which satisfies the assembly rules described in the rules file at S55 will be described. FIGS. 19A to 19D are schematic views showing the connection relation which satisfies the assembly rules.

Figure 19A:
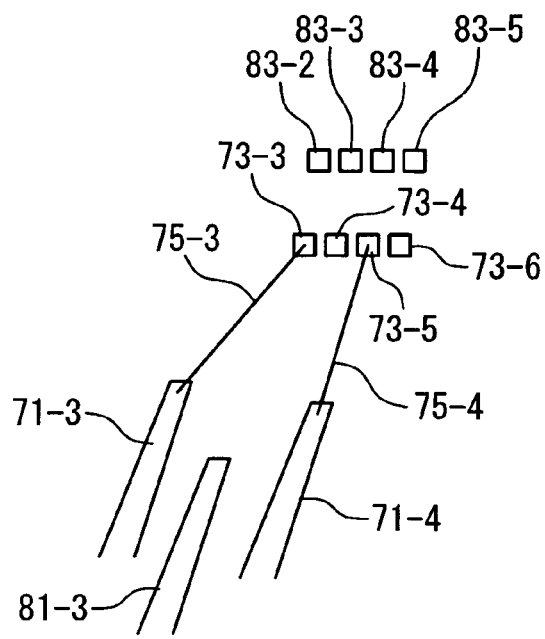
FIGS. 19A to 19D are schematic views showing connection relations which satisfy the assembly rules.
Figure 19B:
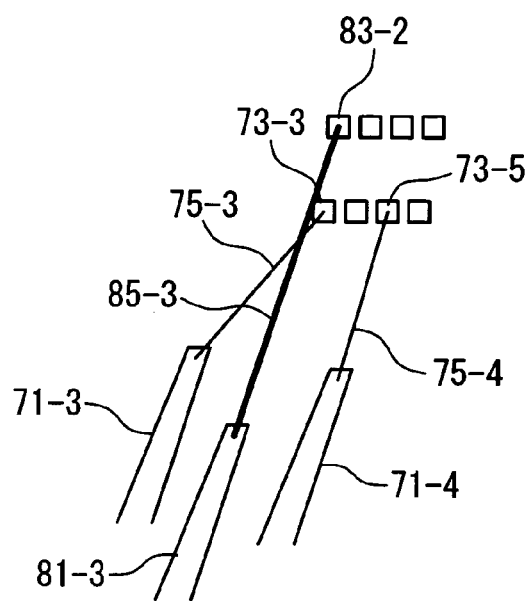
Figure 19C:
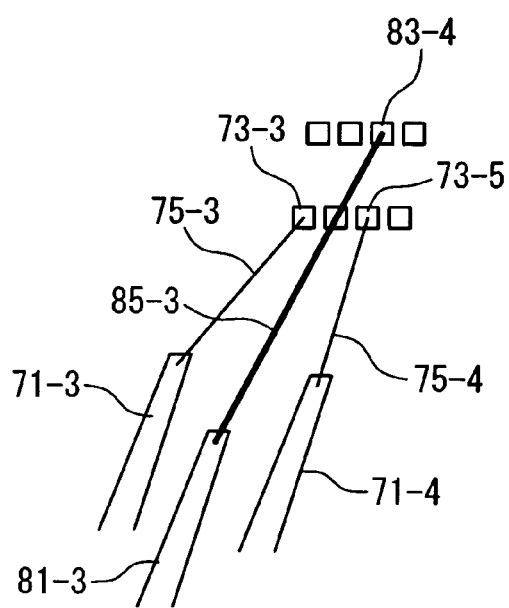
Figure 19D:
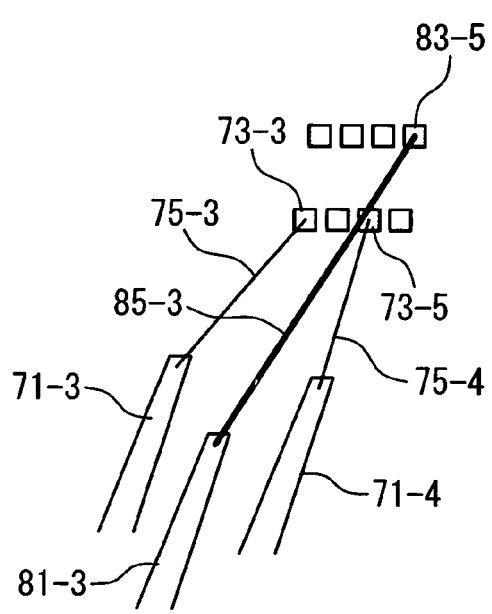

FIG. 19A shows the state immediately before S54, for example. At this time, the stitches 71-3 and 71-4 have the connection relations (the wires 75-3 and 75-4) with the pads 73-3 and 73-5 having corresponding relative positions respectively, through the inside-inside equal pin-connection processing (S52). After that, at the outside-outside equal pin-connection processing (S54), the sequential outside wiring processing section 44-2 searches for the pad 83 which is nearest to the corner (the end) and satisfies the assembly rules described in the rules file when connected to the stitch 81-3. For example, in the case of FIG. 19B, it is judged that the assembly rules are not satisfied since the wire 85-3 overlaps the wire 75-3. In the case of FIGS. 19C and 19D, since the wire 85-3 does not overlap other wires 75, the assembly rules are satisfied if other conditions (double connection, wire lengths, wire angles, and so on) are satisfied. However, a connection is performed with the pad 83-4 as shown in not FIG. 19D but FIG. 19C because of the conditions that the pad 83 should be nearest to the corner (the end).

As a result, it is possible to automatically connect a stitch 71 to an unconnected pad 73 having the relative position nearest to the relative position of the stitch 71. After that, it is also possible to automatically connect a stitch 81 to an unconnected pad 83 which meets the assembly rules, by taking the assembly rules into consideration. In this case, the stitch 71 and the pad 73 with approximately equal relative positions are connected through the inside-inside equal pin-connection processing, making it possible to automatically set the connection relation which satisfies the assembly rules described in the rules file. In addition, it is possible as a whole, to automatically set the connection relations which satisfy the assembly rules, since the connection between the stitch 81 and the pad 83 is performed taking the assembly rules into consideration through the outside-outside equal pin-connection processing. Therefore, spaces between the wires are approximately equal as in the case of the pin-connection manually performed by designers, preventing wire shorts at an encapsulation and decreasing yield man-hours at manufacturing. Consequently, corrections in connection relations made by workers can be greatly decreased, making it possible to decrease the work burden, working man-hours, working time, design TAT, and manufacturing time. Also, an yield can be improved with the reduction in the manufacturing time.

The above embodiment shows the case where the stitch 71 and the pad 73 are connected and the stitch 81 and the pad 83 are connected. However, the present invention is not limited to such a case. For example, FIGS. 20 and 21 show other cases.

Figure 20:
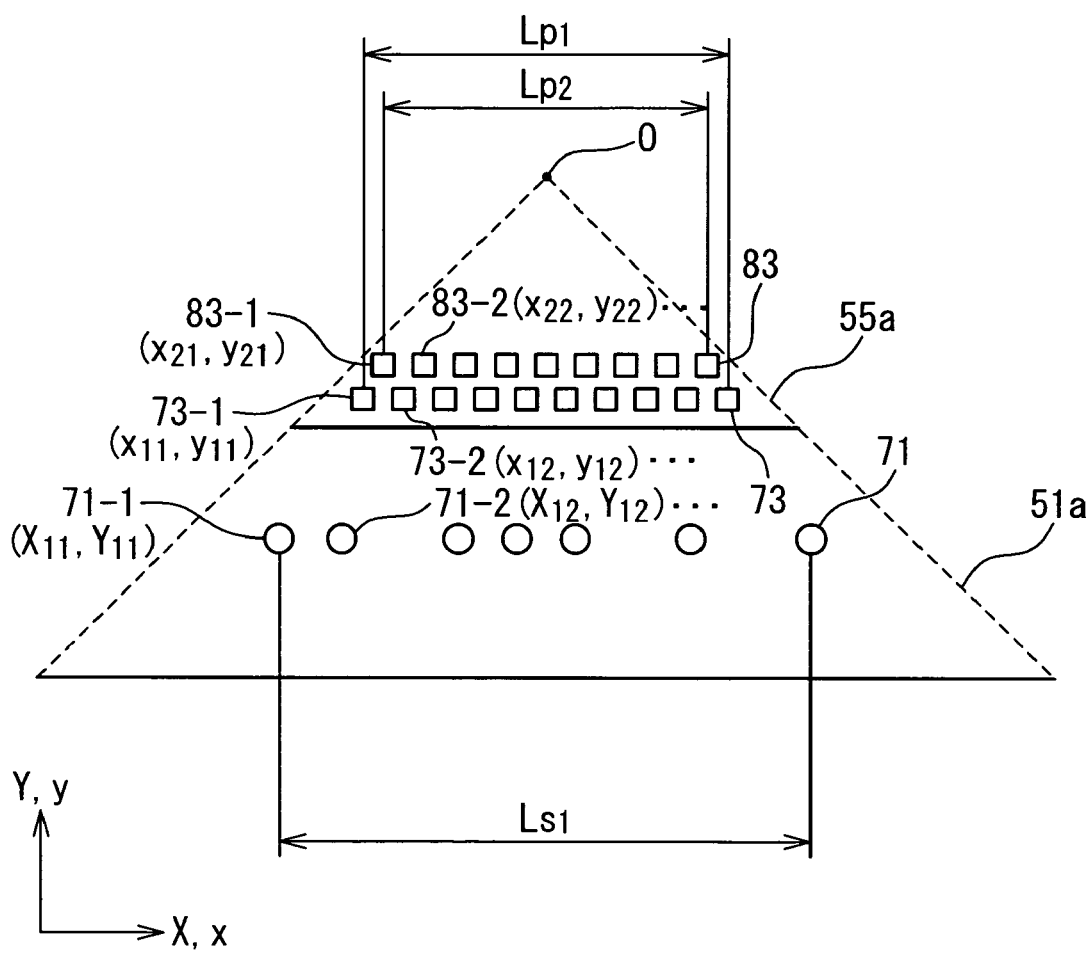
FIG. 20 is a schematic view showing another example of coordinates of each electrode.
Figure 21:
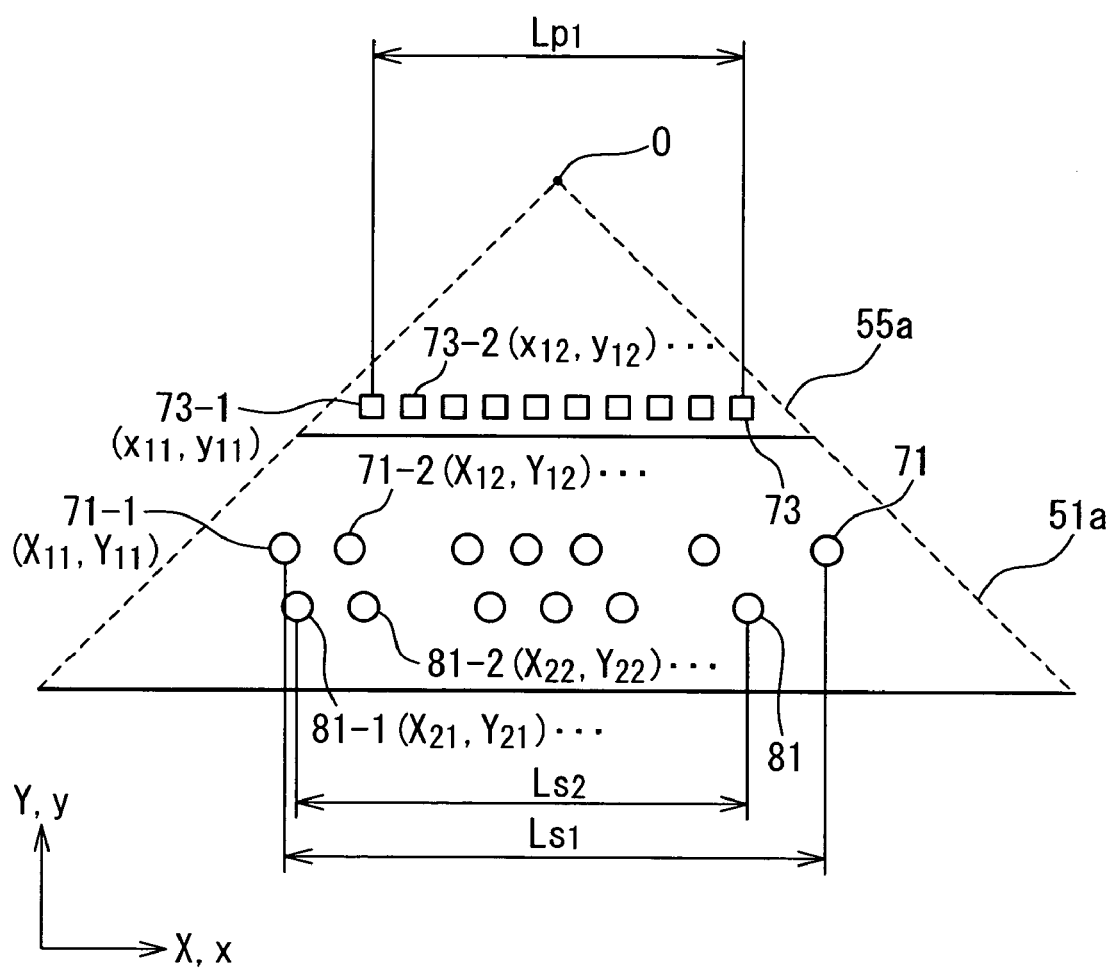
FIG. 21 is a schematic view showing still another example of coordinates of each electrode.

FIG. 20 is a schematic view showing another example of coordinates of each electrode. The direction parallel to the sides of the package substrate 51 and the chip substrate 55 is the X-axis and the x-axis, while the direction vertical to the sides of the package substrate 51 and the chip substrate 55 is the Y-axis and the y-axis. Here, an intersection point O of the diagonal lines is defined as the common origin of the stitch coordinates and the pad coordinates as in the case of FIG. 6. In FIG. 20, the seven stitches 71 are provided to one side of the package substrate 51 in approximately a straight line, and the ten pads 73 and the nine pads 83 are provided to one side of the chip substrate 55 in approximately a straight line. For example, in the line of the stitches 71, the coordinates of the leftmost stitch 71-1 are $(X_{11}, Y_{11})$, the coordinates of the next stitch 71-2 are $(X_{12}, Y_{12})$, and so forth. In the line of the pads 73, the coordinates of the leftmost pad 73-1 are $(x_{11}, y_{11})$, the coordinates of the next pad 73-2 are $(x_{12}, y_{12})$, and so forth. In the line of the pads 83, the coordinates of the leftmost pad 83-1 are $(x_{21}, y_{21})$, the coordinates of the next pad 83-2 are $(x_{22}, y_{22})$, and so forth.

In this case of the pin-connection processing, it is both possible for the stitch 71 to be connected to only one of the pad 73 and the pad 83, and to be connected to both the pad 73 and the pad 83.

In the former case, the relative positions are determined by taking only the x-coordinates into consideration. Therefore, the first or second embodiment is applicable to both the pads 73 and 83. In the case of connection however, the y-coordinates are also considered.

In the latter case too, the relative positions are determined by taking only the x-coordinates into consideration. Therefore, the pads 73 and 83 can be equally dealt with, and the first or second embodiment is applicable. In the case of connection however, the y-coordinates are also considered.

Here, choice of either the former case or the latter case may be made by designers at the same time as the specification of other data at S101 of FIG. 8 for example.

FIG. 21 is a schematic view showing another example of coordinates of each electrode. The direction parallel to the sides of the package substrate 51 and the chip substrate 55 is the X-axis and the x-axis, while the direction vertical to the sides of the package substrate 51 and the chip substrate 55 is the Y-axis and the y-axis. Here, the intersection point O of the diagonal lines is defined as the common origin of the stitch coordinates and the pad coordinates as in the case of FIG. 6.

In FIG. 21, the seven stitches 71 and the six stitches 81 are provided to one side of the package substrate 51 in approximately a straight line, and the ten pads 73 are provided to one side of the chip substrate 55 in approximately a straight line. For example, in the line of the stitches 71, the coordinates of the leftmost stitch 71-1 are $(X_{11}, Y_{11})$, the coordinates of the next stitch 71-2 are $(X_{12}, Y_{12})$, and so forth. In the line of the stitches 81, the coordinates of the leftmost stitch 81-1 are $(X_{21}, Y_{21})$, the coordinates of the next stitch 81-2 are $(X_{22}, Y_{22})$, and so forth. In the line of the pads 73, the coordinates of the leftmost pad 73-1 are $(x_{11}, y_{11})$, the coordinates of the next pad 73-2 are $(x_{12}, y_{12})$, and so forth.

In this case of the pin-connection processing, it is possible to connect either the stitch 71 or the stitch 81, to the pad 73.

In this case, for example, each of the stitches such as the stitch 71-1 and so forth, and each of the stitches such as the stitch 81-1 and so forth, are made to have properties indicating the line of the stitches 71 and the line of the stitches 81, respectively. As a result, it is possible to set a connection relation between a stitch selected from the stitches 71 and 81, and the pad 73, by applying the first or second embodiment.

Additionally, the choice of either the stitch 71 or the stitch 81 may be made by designers at the same time as the specification of other data at S101 of FIG. 8, for example.

In the present invention, the above first to third embodiments show the case where the number of stitches is larger than that of pads. Therefore, the pads to be connected are assigned from the stitches. However, in the case of the number of stitches being smaller than that of pads too, the present invention can be implemented in the same way as the above first to third embodiments by assigning the stitches to be connected from the pads. In this case too, the same effect as the above first to third embodiments can be obtained. Whether the number of stitches is greater or smaller than the number of pads can automatically be determined by the pin assign processing section 31 for example.

In the above first to third embodiments, the setting of connection relations is performed with respect to all the stitches and pads of each side of the package substrate 51 and the chip substrate 55. The present invention however, is not limited to such a case, and the setting of connection relations may be performed with respect to part of stitches and pads of each side. For example, it is possible to specify that each of the above embodiments should be performed with respect to only part of the stitches and pads of each side. Such specification may be made by designers at the same time as the specification of other data at S101 of FIG. 8 for example.

When there are unconnected stitches and pads in each side in part of the design data 3 already outputted for example, it is possible to newly specify the unconnected stitches and pads and further perform each of the above embodiments. As a result, additional data can be added to the design data 3. Such specification may be made by designers at the same time as the specification of other data at S101 of FIG. 8 for example.

The connection of the first substrate (first electrode) and the second substrate (second electrode) according to the present invention is applicable to the connection between a die chip (pad) and a die chip (pad) and the connection between a die chip (pad) and an interposer (stitch) for example, as high-density packaging technology of LSI chips typified by a MCM (Multi-Chip Module) and a SIP (System In Package).

According to the present invention, it is possible in conducting the assembly study of the early stage, to conduct optimum assembly study in a short period of time by automating the pin-connection processing and making manual corrections based on the result of the automatic pin-connection.

The present invention can be implemented in a program as mentioned above, which can be described as shown below.

A computer (software) program product for an LSI design support method according to the present invention, embodied on a computer-readable medium and including code that, when executed, causes a computer to perform the following:

(a) acquiring first position data concerning positions of a plurality of first electrodes provided along a side of a first substrate, and second position data concerning positions of a plurality of second electrodes provided along a side of a second substrate; and (b) setting connection relations between the plurality of the first electrodes and the plurality of the second electrodes such that each of the plurality of the first electrodes is connected to one of the plurality of the second electrodes which has a second relative position nearest to a first relative position of the each of the plurality of the first electrodes, wherein the first relative position is a relative position of each of the plurality of the first electrodes in a line of the plurality of the first electrodes defined based on the first position data, and wherein the second relative position is a relative position of each of the plurality of the second electrodes in a line of the plurality of the second electrodes defined based on the second position data.

In the program, the step (b) includes:

(b1) setting connection relations between two first end electrodes and two second end electrodes such that each of the two first end electrodes is connected to corresponding one of the two second end electrodes, wherein the two first end electrodes are two of the plurality of the first electrodes at both ends, and the two second end electrodes are two of the plurality of the second electrodes at both ends, (b2) setting connection relations between a third electrode and a fourth electrode such that the third electrode is connected to the fourth electrode, wherein the third electrode is one of the plurality of the first electrodes at an end, of which connection relations are not set yet, and the fourth electrode is one of the plurality of the second electrodes at a same end, which satisfies assembly rules concerning wiring and has the second relative position nearest to the first relative position of the third electrode, and (b3) performing the step (b2) in order starting from one of the plurality of the first electrodes next to one of the two first end electrodes.

In the program, the step (b) includes:

(b4) setting connection relations between two first end electrodes and two second end electrodes such that each of the two first end electrodes is connected to corresponding one of the two second end electrodes, wherein the two first end electrodes are two of the plurality of the first electrodes at both ends, and the two second end electrodes are two of the plurality of the second electrodes at both ends, (b5) setting connection relations between two third electrodes and two fourth electrode such that each of the two third electrodes is connected to corresponding one of the two fourth electrodes, wherein the two third electrodes are two of the plurality of the first electrodes at both ends or a center, of which connection relations are not set yet, and the two fourth electrodes are two of the plurality of the second electrodes at both ends or a center, which satisfies assembly rules concerning wiring and has the second relative position nearest to the first relative position of the third electrode, and (b6) performing settings of the connection relations between the two third electrodes and the fourth electrodes for all the plurality of first electrodes excluding the two first end electrodes.

In the program, the step (b2) includes:

(b21) when connection relations cannot be set to satisfy the assembly rules with respect to the third electrode and the fourth electrode, shifting all of or part of the plurality of the second electrodes with connection relations already set among the plurality of the second electrodes excluding the two second end electrodes, toward the two second end electrodes while satisfying the assembly rules, and (b22) setting connection relations between the third electrode and the fourth electrode such that the third electrode is connected to the fourth electrode.

In the program, the step (b) includes:

(b7) setting connection relations between two first end electrodes and two second end electrodes such that each of the two first end electrodes is connected to corresponding one of the two second end electrodes, wherein the two first end electrodes are two of the plurality of the first electrodes at both ends, and the two second end electrodes are two of the plurality of the second electrodes at both ends, and (b8) setting connection relations between a plurality of third electrodes and a plurality of fourth electrodes such that each of the plurality of the third electrodes is connected to corresponding one of the plurality of the fourth electrodes, wherein the plurality of the third electrodes is as the plurality of the first electrodes excluding the two first end electrodes, and wherein the plurality of the fourth electrodes is as the plurality of the second electrodes, which has the second relative position nearest to the first relative position of each of the plurality of the third electrodes.

In the program, the step (b8) includes:

(b81) when a connection relation which does not satisfy assembly rules concerning wiring is set between a fifth electrode as one of the plurality of the third electrodes and a sixth electrode as one of the plurality of the fourth electrodes, shifting part of the plurality of the fourth electrodes with connection relations already set between part of the plurality of the third electrodes from a next to one of the first end electrodes to just before the fifth electrode, toward one of the second end electrodes corresponding to the one of the first electrodes, such that the assembly rules are satisfied, and (b82) resetting a connection relation between the vacated fourth electrode and the fifth electrode to satisfy the assembly rules.

In the program, the step (b8) includes:

(b83) when a connection relation which does not satisfy assembly rules concerning wiring is set between a fifth electrode as one of the plurality of the third electrodes and a sixth electrode as one of the plurality of the fourth electrodes, and when the fifth electrode is positioned between a seventh electrode at one end among the plurality of third electrodes and an eighth electrode at the center among the plurality of third electrodes, shifting part of the plurality of the fourth electrodes with connection relations being set between part of the plurality of the third electrodes from the seventh electrode to just before the fifth electrode, toward the one of the second end electrodes corresponding to the seventh electrode such that the assembly rules are satisfied, and (b84) resetting a connection relation between the vacated fourth electrode and the fifth electrode to satisfy the assembly rules.

In the program, the step (b8) includes:

(b85) when a connection relation which does not satisfy assembly rules concerning wiring is set between a fifth electrode as one of the plurality of the third electrodes and a sixth electrode as one of the plurality of the fourth electrodes, and when the fifth electrode is positioned between a seventh electrode at one end among the plurality of third electrodes and an eighth electrode at the center among the plurality of third electrodes, shifting part of the plurality of the fourth electrodes with connection relations being set between part of the plurality of the third electrodes from the eighth electrode to just before the fifth electrode, toward the one of the plurality of the second electrodes at a center corresponding to the eighth electrode such that the assembly rules are satisfied, and (b86) resetting a connection relation between the vacated fourth electrode and the fifth electrode to satisfy the assembly rules.

A computer (software) program product for an LSI design support method according to the present invention, embodied on a computer-readable medium and including code that, when executed, causes a computer to perform the following:

(a) acquiring first position data concerning positions of a plurality of first electrodes provided along a side of a first substrate, third position data concerning positions of a plurality of third electrodes provided along the side of the first substrate, second position data concerning positions of a plurality of second electrodes provided along a side of a second substrate and fourth position data concerning positions of a plurality of fourth electrodes provided along the side of the second substrate, wherein the plurality of the third electrodes are provided farther than the plurality of the first electrodes from the side of the second substrate, and the plurality of the fourth electrodes are provided farther than the plurality of the second electrodes from the side of the second substrate;

(b) setting a connection relation between a first end electrode and a second end electrode such that the first end electrode is connected to the second end electrode, wherein the first end electrode is one of the plurality of the first electrodes at an end, the second end electrode is one of the plurality of the second electrode at a same end;

(c) setting connection relations between the plurality of the first electrodes and the plurality of the second electrodes such that each of the plurality of the first electrodes with no connection relations being set is connected to one of the plurality of the second electrodes which has a second relative position nearest to a first relative position of the each of the plurality of first electrodes and satisfies assembly rules concerning wiring among the plurality of the second electrodes, wherein the first relative position is a relative position of each of the plurality of the first electrodes in a line of the plurality of the first electrodes defined based on the first position data, and the second relative position is a relative position of each of the plurality of the second electrodes in a line of the plurality of the second electrodes defined based on the second position data;

(d) setting a connection relation between a fifth electrode and a sixth electrode based on the third position data and the fourth position data such that the fifth electrode is connected to the sixth electrode, wherein the fifth electrode is one of the plurality of the third electrodes which is nearest to an end with no connection relation being set, and the sixth electrode is one of the plurality of the fourth electrodes which is nearest to an end and satisfies the assembly rules; and (e) performing the step (d) to the plurality of the third electrodes in order.

In the program, the step (e) includes:

(e1) when a connection relation which satisfies the assembly rules cannot be set between the fifth electrode and the sixth electrode, stopping of setting of the connection relation between the fifth electrode and the sixth electrode, the program further includes:

(f) canceling all settings of the connection relations set just before the steps (c) and (d);

(g) setting a connection relation between a seventh electrode and an eighth electrode such that the seventh electrode is connected to the eighth electrode, wherein the seventh electrode is one of the plurality of the first electrodes which is nearest to the first end electrode with no connection relation being set, and the eighth electrode is one of the plurality of the second electrodes which satisfies the assembly rules and nearest to the second end electrode;

(h) setting a connection relation between a ninth electrode and a tenth electrode such that the ninth electrode is connected to the tenth electrode, wherein the ninth electrode is one of the plurality of the third electrodes which is nearest to an end with no connection relation being set, the tenth electrode is one of the plurality of the fourth electrodes which is nearest to a same end and satisfies the assembly rules; and (i) performing the steps (c), (e) and (f) in this order.

It is apparent that the present invention is not limited to the above embodiment that may be modified and changed without departing from the scope and spirit of the invention.

What is claimed is:

1. An LSI design support apparatus comprising:
a data acquisition section configured to acquire first position data concerning positions of a plurality of first electrodes provided along a side of a first substrate, and second position data concerning positions of a plurality of second electrodes provided along a side of a second substrate; and
an equal processing section configured to set connection relations between said plurality of the first electrodes and said plurality of the second electrodes such that each of said plurality of the first electrodes is connected to one of said plurality of the second electrodes which has a second relative position nearest to a first relative position of said each of the plurality of the first electrodes,
wherein said first relative position is a relative position of each of the plurality of the first electrodes in a line of said plurality of the first electrodes defined based on the first position data, and
wherein said second relative position is a relative position of each of the plurality of the second electrodes in a line of said plurality of the second electrodes defined based on the second position data.

2. The LSI design support apparatus according to claim 1, wherein said equal processing section includes:
an end connection processing section configured to set connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, and
a sequential equal processing section configured to set connection relations between a third electrode and a fourth electrode such that said third electrode is connected to said fourth electrode, wherein said third electrode is one of said plurality of the first electrodes at an end, of which connection relations are not set yet, and said fourth electrode is one of said plurality of the second electrodes at a same end, which satisfies assembly rules concerning wiring and has said second relative position nearest to said first relative position of said third electrode.

3. The LSI design support apparatus according to claim 2, further comprising:
a correction processing section configured to shift all of or part of said plurality of the second electrodes with connection relations already set among said plurality of the second electrodes excluding said two second end electrodes, toward said two second end electrodes while satisfying said assembly rules, when connection relations cannot be set to satisfy said assembly rules with respect to said third electrode and said fourth electrode,
wherein said correction processing section sets connection relations between said third electrode and said fourth electrode such that said third electrode is connected to said fourth electrode.

4. The LSI design support apparatus according to claim 1, wherein said equal processing section includes:
an end connection processing section configured to set connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, and
a sequential equal processing section configured to set connection relations between a third electrodes and two fourth electrode such that said two third electrodes is connected to corresponding one of said two fourth electrodes, wherein said two third electrodes are two of said plurality of the first electrodes at both ends or a center, of which connection relations are not set yet, and said two fourth electrodes are two of said plurality of the second electrodes at both ends or a center ,which satisfies assembly rules concerning wiring and has said second relative position nearest to said first relative position of said third electrode 5. The LSI design support apparatus according to claim 1, wherein said equal processing section includes:
an end connection processing section configured to set connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, and
a collective equal processing section configured to set connection relations between a plurality of third electrodes and a plurality of fourth electrodes such that each of said plurality of the third electrodes is connected to corresponding one of said plurality of the fourth electrodes,
wherein said plurality of the third electrodes is as said plurality of the first electrodes excluding said two first end electrodes, and
wherein said plurality of the fourth electrodes is as said plurality of the second electrodes, which has said second relative position nearest to said first relative position of each of the plurality of the third electrodes.

6. The LSI design support apparatus according to claim 5, further comprising:

a correction processing section configured to reset connection relations between said plurality of the third electrodes and said plurality of the fourth electrodes from one of said two first end electrodes toward the other of said two first end electrodes in sequence so as to satisfy said assembly rules, when a connection relation which does not satisfy assembly rules concerning wiring is set between a fifth electrode as one of said plurality of the third electrodes and a sixth electrode as one of said plurality of the fourth electrodes.

7. The LSI design support apparatus according to claim 5, further comprising:

a correction processing section configured to reset connection relations between said plurality of the third electrodes and said plurality of the fourth electrodes from a seventh electrode as one of said plurality of the third electrodes at one end toward an eighth electrode as one of said plurality of the third electrodes at a center, and from a ninth electrode as one of said plurality of the third electrodes at the other end toward a tenth electrode as one of said plurality of the third electrodes at said center in sequence so as to satisfy said assembly rules, when a connection relation which does not satisfy assembly rules concerning wiring is set between a fifth electrode as one of said plurality of the third electrodes and a sixth electrode as one of said plurality of the fourth electrodes.

8. The LSI design support apparatus according to claim 5, further comprising:

a correction processing section configured to reset connection relations between said plurality of the third electrodes and said plurality of the fourth electrodes from an eighth electrode as one of said plurality of the third electrodes at a center toward a seventh electrode as one of said plurality of the third electrodes at one end, and from a tenth electrode as one of said plurality of the third electrodes at said center toward a ninth electrode as one of said plurality of the third electrodes at the other end in sequence so as to satisfy said assembly rules, when a connection relation which does not satisfy assembly rules concerning wiring is set between a fifth electrode as one of said plurality of the third electrodes and a sixth electrode as one of said plurality of the fourth electrodes.

9. An LSI design support apparatus comprising:

a data acquisition section configured to acquire first position data concerning positions of a plurality of first electrodes provided along a side of a first substrate, third position data concerning positions of a plurality of third electrodes provided along said side of the first substrate, second position data concerning positions of a plurality of second electrodes provided along a side of a second substrate and fourth position data concerning positions of a plurality of fourth electrodes provided along said side of the second substrate, wherein said plurality of the third electrodes are provided farther than said plurality of the first electrodes from said side of the second substrate, and said plurality of the fourth electrodes are provided farther than said plurality of the second electrodes from said side of the second substrate;

a first end connection processing section configured to set a connection relation between a first end electrode and a second end electrode such that said first end electrode is connected to said second end electrode, wherein said first end electrode is one of said plurality of the first electrodes at an end, said second end electrode is one of said plurality of the second electrode at a same end;

an equal processing section configured to set connection relations between said plurality of the first electrodes and said plurality of the second electrodes such that each of said plurality of the first electrodes with no connection relations being set is connected to one of said plurality of said second electrodes which has a second relative position nearest to a first relative position of said each of the plurality of first electrodes and satisfies assembly rules concerning wiring among said plurality of the second electrodes, wherein said first relative position is a relative position of each of the plurality of the first electrodes in a line of said plurality of the first electrodes defined based on the first position data, and said second relative position is a relative position of each of the plurality of the second electrodes in a line of said plurality of the second electrodes defined based on the second position data; and an outside wiring processing section configured to set a connection relation between a fifth electrode and a sixth electrode based on said third position data and said fourth position data such that said fifth electrode is connected to said sixth electrode, wherein said fifth electrode is one of said plurality of the third electrodes which is nearest to an end with no connection relation being set, and said sixth electrode is one of said plurality of the fourth electrodes which is nearest to an end and satisfies said assembly rules, wherein said outside wiring processing section performs setting of the connection relation between said fifth electrode and said sixth electrode for said plurality of the third electrodes in order.

10. The LSI design support apparatus according to claim 9, wherein when a connection relation which satisfies said assembly rules cannot be set between said fifth electrode and said sixth electrode, said outside wiring processing section stops setting of the connection relation between said fifth electrode and said sixth electrode, said LSI design support apparatus further comprises:

an setting cancel section configured to cancel all settings of the connection relations set just before by said equal processing section and said outside wiring processing section; and an end resetting section configured to set a connection relation between a seventh electrode and an eighth electrode such that said seventh electrode is connected to said eighth electrode, wherein said seventh electrode is one of said plurality of the first electrodes which is nearest to said first end electrode and has no connection relation being set, and said eighth electrode is one of said plurality of the second electrodes which satisfies said assembly rules and nearest to said second end electrode, wherein said end resetting section sets a connection relation between a ninth electrode and a tenth electrode such that said ninth electrode is connected to said tenth electrode, wherein said ninth electrode is one of said plurality of the third electrodes which is nearest to an end and has no connection relation being set, said tenth electrode is one of said plurality of the fourth electrodes which is nearest to a same end and satisfies said assembly rules, and wherein said equal processing section and said outside wiring processing section performs their processing in this order.

11. An LSI design support method comprising:

(a) acquiring first position data concerning positions of a plurality of first electrodes provided along a side of a first substrate, and second position data concerning positions of a plurality of second electrodes provided along a side of a second substrate; and (b) setting connection relations between said plurality of the first electrodes and said plurality of the second electrodes such that each of said plurality of the first electrodes is connected to one of said plurality of the second electrodes which has a second relative position nearest to a first relative position of said each of the plurality of the first electrodes, wherein said first relative position is a relative position of each of the plurality of the first electrodes in a line of said plurality of the first electrodes defined based on the first position data, and wherein said second relative position is a relative position of each of the plurality of the second electrodes in a line of said plurality of the second electrodes defined based on the second position data.

12. The LSI design support method according to claim 11, wherein said step (b) includes:

(b1) setting connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, (b2) setting connection relations between a third electrode and a fourth electrode such that said third electrode is connected to said fourth electrode, wherein said third electrode is one of said plurality of the first electrodes at an end, of which connection relations are not set yet, and said fourth electrode is one of said plurality of the second electrodes at a same end, which satisfies assembly rules concerning wiring and has said second relative position nearest to said first relative position of said third electrode, and (b3) performing said step (b2) in order starting from one of said plurality of the first electrodes next to one of said two first end electrodes.

13. The LSI design support method according to claim 12, wherein said step (b2) includes:

(b21) when connection relations cannot be set to satisfy said assembly rules with respect to said third electrode and said fourth electrode, shifting all of or part of said plurality of the second electrodes with connection relations already set among said plurality of the second electrodes excluding said two second end electrodes, toward said two second end electrodes while satisfying said assembly rules, and (b22) setting connection relations between said third electrode and said fourth electrode such that said third electrode is connected to said fourth electrode.

14. The LSI design support method according to claim 11, wherein said step (b) includes:

(b4) setting connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, (b5) setting connection relations between two third electrodes and two fourth electrode such that each of said two third electrodes is connected to corresponding one of said two fourth electrodes, wherein said two third electrodes are two of said plurality of the first electrodes at both ends or a center, of which connection relations are not set yet, and said two fourth electrodes are two of said plurality of the second electrodes at both ends or a center, which satisfies assembly rules concerning wiring and has said second relative position nearest to said first relative position of said third electrode, and (b6) performing settings of the connection relations between said two third electrodes and said fourth electrodes for all said plurality of first electrodes excluding said two first end electrodes.

15. The LSI design support method according to claim 11, wherein said step (b) includes:

(b7) setting connection relations between two first end electrodes and two second end electrodes such that each of said two first end electrodes is connected to corresponding one of said two second end electrodes, wherein said two first end electrodes are two of said plurality of the first electrodes at both ends, and said two second end electrodes are two of said plurality of the second electrodes at both ends, and (b8) setting connection relations between a plurality of third electrodes and a plurality of fourth electrodes such that each of said plurality of the third electrodes is connected to corresponding one of said plurality of the fourth electrodes, wherein said plurality of the third electrodes is as said plurality of the first electrodes excluding said two first end electrodes, and wherein said plurality of the fourth electrodes is as said plurality of the second electrodes, which has said second relative position nearest to said first relative position of each of the plurality of the third electrodes.

16. The LSI design support method according to claim 15, wherein said step (b8) includes:

(b81) when a connection relation which does not satisfy assembly rules concerning wiring is set between a fifth electrode as one of said plurality of the third electrodes and a sixth electrode as one of said plurality of the fourth electrodes, shifting part of said plurality of the fourth electrodes with connection relations already set between part of said plurality of the third electrodes from a next to one of said first end electrodes to just before said fifth electrode, toward one of the second end electrodes corresponding to said one of the first electrodes, such that said assembly rules are satisfied, and (b82) resetting a connection relation between said vacated fourth electrode and said fifth electrode to satisfy the assembly rules.

17. The LSI design support method according to claim 15, wherein said step (b8) includes:

(b83) when a connection relation which does not satisfy assembly rules concerning wiring is set between a fifth electrode as one of said plurality of the third electrodes and a sixth electrode as one of said plurality of the fourth electrodes, and when said fifth electrode is positioned between a seventh electrode at one end among the plurality of third electrodes and an eighth electrode at the center among the plurality of third electrodes, shifting part of said plurality of the fourth electrodes with connection relations being set between part of said plurality of the third electrodes from said seventh electrode to just before said fifth electrode, toward said one of said second end electrodes corresponding to said seventh electrode such that said assembly rules are satisfied, and (b84) resetting a connection relation between said vacated fourth electrode and said fifth electrode to satisfy the assembly rules.

18. The LSI design support method according to claim 15, wherein said step (b8) includes:
- (b85) when a connection relation which does not satisfy assembly rules concerning wiring is set between a fifth electrode as one of said plurality of the third electrodes and a sixth electrode as one of said plurality of the fourth electrodes, and when said fifth electrode is positioned between a seventh electrode at one end among the plurality of third electrodes and an eighth electrode at the center among the plurality of third electrodes, shifting part of said plurality of the fourth electrodes with connection relations being set between part of said plurality of the third electrodes from said eighth electrode to just before said fifth electrode, toward said one of said plurality of the second electrodes at a center corresponding to said eighth electrode such that said assembly rules are satisfied, and
- (b86) resetting a connection relation between said vacated fourth electrode and said fifth electrode to satisfy the assembly rules.

19. An LSI design support method comprising:
- (a) acquiring first position data concerning positions of a plurality of first electrodes provided along a side of a first substrate, third position data concerning positions of a plurality of third electrodes provided along said side of the first substrate, second position data concerning positions of a plurality of second electrodes provided along a side of a second substrate and fourth position data concerning positions of a plurality of fourth electrodes provided along said side of the second substrate, wherein said plurality of the third electrodes are provided farther than said plurality of the first electrodes from said side of the second substrate, and said plurality of the fourth electrodes are provided farther than said plurality of the second electrodes from said side of the second substrate;
- (b) setting a connection relation between a first end electrode and a second end electrode such that said first end electrode is connected to said second end electrode, wherein said first end electrode is one of said plurality of the first electrodes at an end, said second end electrode is one of said plurality of the second electrode at a same end;
- (c) setting connection relations between said plurality of the first electrodes and said plurality of the second electrodes such that each of said plurality of the first electrodes with no connection relations being set is connected to one of said plurality of said second electrodes which has a second relative position nearest to a first relative position of said each of the plurality of first electrodes and satisfies assembly rules concerning wiring among said plurality of the second electrodes, wherein said first relative position is a relative position of each of the plurality of the first electrodes in a line of said plurality of the first electrodes defined based on the first position data, and said second relative position is a relative position of each of the plurality of the second electrodes in a line of said plurality of the second electrodes defined based on the second position data;
- (d) setting a connection relation between a fifth electrode and a sixth electrode based on said third position data and said fourth position data such that said fifth electrode is connected to said sixth electrode, wherein said fifth electrode is one of said plurality of the third electrodes which is nearest to an end with no connection relation being set, and said sixth electrode is one of said plurality of the fourth electrodes which is nearest to an end and satisfies said assembly rules; and
- (e) performing said step (d) to said plurality of the third electrodes in order.

20. The LSI design support method according to claim 19, wherein said step (e) includes:
- (e1) when a connection relation which satisfies said assembly rules cannot be set between said fifth electrode and said sixth electrode, stopping of setting of the connection relation between said fifth electrode and said sixth electrode, said LSI design support method further comprises:
- (f) canceling all settings of the connection relations set just before said steps (c) and (d);
- (g) setting a connection relation between a seventh electrode and an eighth electrode such that said seventh electrode is connected to said eighth electrode, wherein said seventh electrode is one of said plurality of the first electrodes which is nearest to said first end electrode with no connection relation being set, and said eighth electrode is one of said plurality of the second electrodes which satisfies said assembly rules and nearest to said second end electrode;
- (h) setting a connection relation between a ninth electrode and a tenth electrode such that said ninth electrode is connected to said tenth electrode, wherein said ninth electrode is one of said plurality of the third electrodes which is nearest to an end with no connection relation being set, said tenth electrode is one of said plurality of the fourth electrodes which is nearest to a same end and satisfies said assembly rules; and
- (i) performing said steps (c), (e) and (f) in this order.

* * * * *